United States Patent
Oda

(10) Patent No.: US 9,134,674 B2
(45) Date of Patent: Sep. 15, 2015

(54) REPLACEABLE UNIT, IMAGE FORMING APPARATUS THAT INCORPORATES THE REPLACEABLE UNIT AND METHOD FOR ATTACHING A PART TO THE REPLACEABLE UNIT

(71) Applicant: Oki Data Corporation, Tokyo (JP)

(72) Inventor: Yukiyoshi Oda, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 14/166,811

(22) Filed: Jan. 28, 2014

(65) Prior Publication Data
US 2014/0212151 A1    Jul. 31, 2014

(30) Foreign Application Priority Data
Jan. 31, 2013 (JP) .................................. 2013-016758

(51) Int. Cl.
| | |
|---|---|
| G03G 15/00 | (2006.01) |
| H05K 13/00 | (2006.01) |
| G03G 15/08 | (2006.01) |
| G03G 21/16 | (2006.01) |
| G03G 21/18 | (2006.01) |

(52) U.S. Cl.
CPC ............. G03G 15/55 (2013.01); G03G 15/0863 (2013.01); G03G 21/1652 (2013.01); G03G 21/1871 (2013.01); G03G 21/1885 (2013.01); H05K 13/00 (2013.01); *Y10T 29/49117* (2015.01)

(58) Field of Classification Search
CPC ....................... G03G 21/1652; G03G 21/1871
USPC ....................................... 399/12, 13
See application file for complete search history.

(56) References Cited

U.S. PATENT DOCUMENTS

| | | | |
|---|---|---|---|
| 2002/0031357 A1* | 3/2002 | Watanabe et al. ................ | 399/12 |
| 2003/0215257 A1* | 11/2003 | Karakama et al. ............... | 399/90 |
| 2007/0086806 A1 | 4/2007 | Burchette et al. | |
| 2012/0200871 A1* | 8/2012 | Takahashi et al. .............. | 358/1.9 |
| 2014/0086597 A1* | 3/2014 | Tanabe et al. .................... | 399/12 |

FOREIGN PATENT DOCUMENTS

| | | |
|---|---|---|
| CN | 201494096 U | 6/2010 |
| JP | 2003-51688 | 2/2003 |
| JP | 2003-330335 A | 11/2003 |
| JP | 2005-135305 A | 5/2005 |
| JP | 2007-271895 A | 10/2007 |
| JP | 2011-118160 | 6/2011 |
| JP | 2011118160 A * | 6/2011 |

* cited by examiner

*Primary Examiner* — David Gray
*Assistant Examiner* — Tyler Hardman
(74) *Attorney, Agent, or Firm* — Rabin & Berdo, P.C.

(57) ABSTRACT

A replaceable unit is removably inserted into an apparatus. An installation detecting board has a first edge, a second edge a third edge, and a fourth edge. The first edge is located on a side of the installation detecting board opposite the second edge. The third edge is located on a side of the installation detecting board opposite the fourth edge. The replaceable unit has a body in which a first positioning portion and a second positioning portion are formed. The first and second positioning portion are aligned in the longitudinal direction of the replaceable unit such that the first positioning portion abuts the first edge and the second positioning portion abuts the second edge. A retainer is mounted on the body, and abuts at least one of the third edge and the fourth edge to prevent the installation detecting board from moving relative to the body.

23 Claims, 33 Drawing Sheets

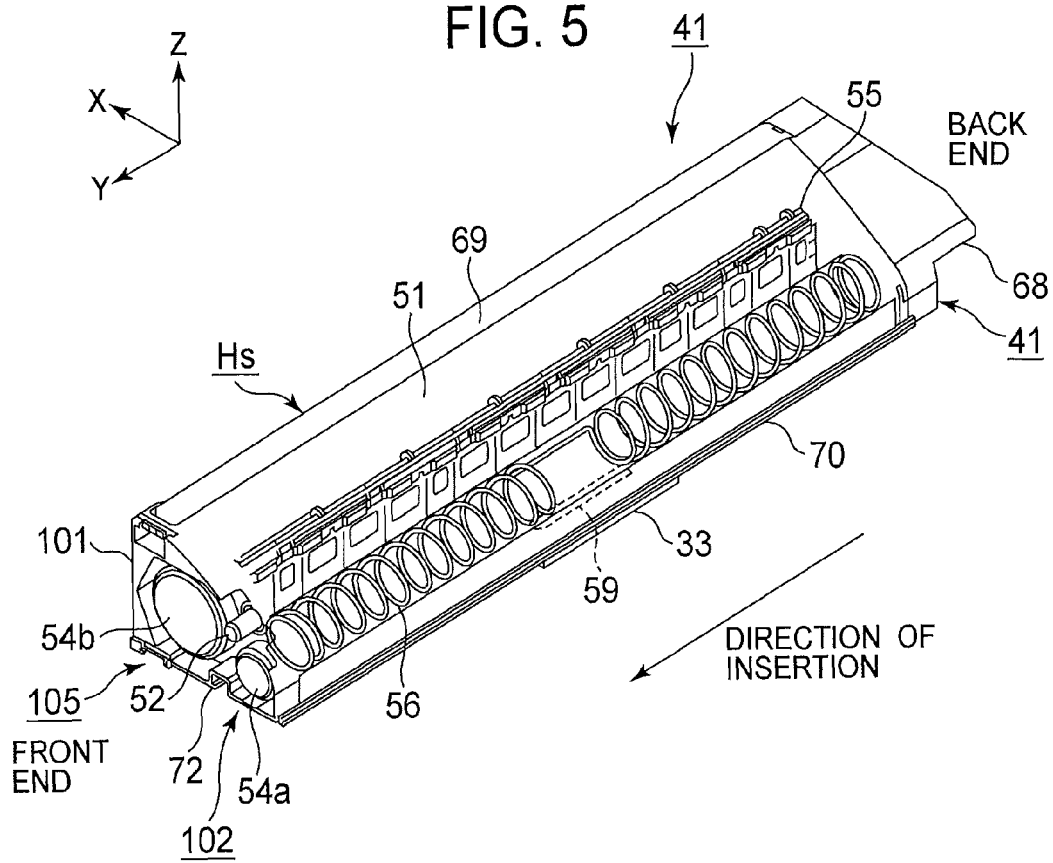
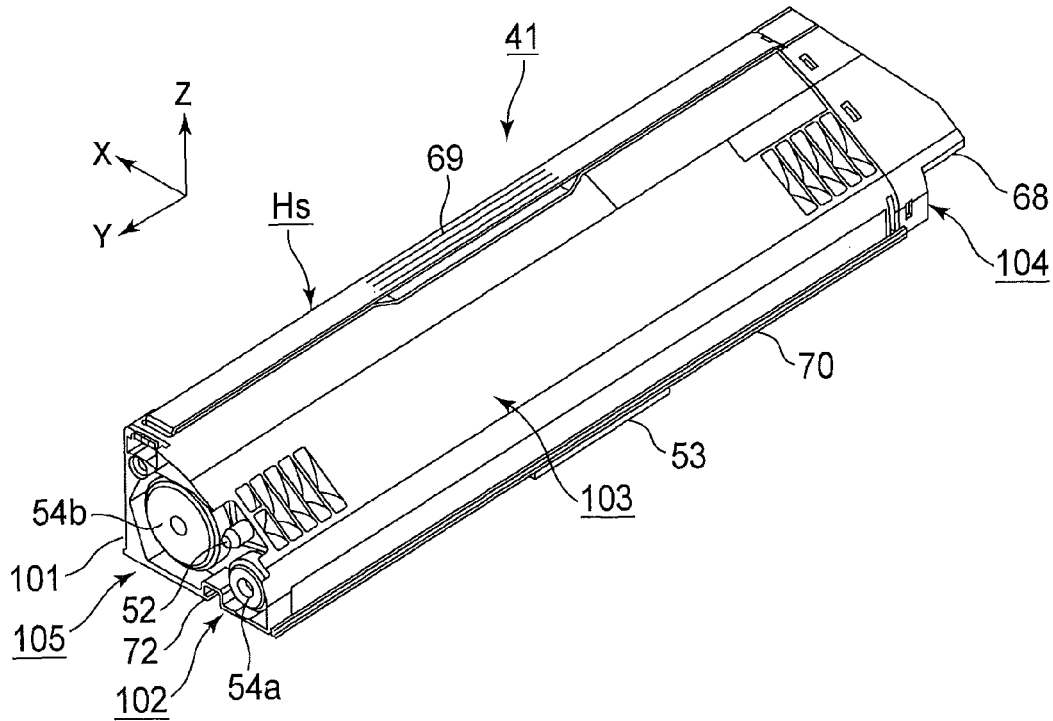

$H_2 < H_1 < H_3 = H_4 = H_5$

REPLACEABLE UNIT, IMAGE FORMING APPARATUS THAT INCORPORATES THE REPLACEABLE UNIT AND METHOD FOR ATTACHING A PART TO THE REPLACEABLE UNIT

BACKGROUND OF THE INVENTION

1. Field of the Invention

The present invention relates to a replaceable unit, an image forming apparatus that incorporates the replaceable unit, and a method for attaching components to the replaceable unit.

2. Description of the Related Art

Among existing image forming apparatus including printers, copying machines, and facsimile machines is an electrophotographic color printer. Image forming units for black, yellow, magenta, and cyan images are detachably attached to the body of the printer, and are aligned in order. With each image forming unit, a charging roller uniformly charges the surface of a photoconductive drum. A light emitting diode (LED) head illuminates the charged surface of the photoconductive drum in accordance with print data to form an electrostatic latent image on the charged surface. A developing roller supplies a developer material of a corresponding color to the electrostatic latent image to develop the electrostatic latent image into a toner image of the corresponding color.

Subsequently, as the paper advances through the respective image forming units, the toner images of the respective colors are transferred by transfer rollers from the photoconductive drums onto paper one over the other in registration to form a full color toner image on the paper.

With the printer of the aforementioned configuration, the image forming units are replaceable parts. When the photoconductive drum, charging roller, developing roller and other parts in an image forming unit reach the end of their lives or when the toner in the toner tank of an image forming unit is exhausted, the image forming unit is replaced.

If the printer is configured such that the toner cartridges are detachably attached to the corresponding image forming units, each of the toner cartridges is also a replaceable unit, which is replaced with a new, unused one upon exhaustion of the toner.

The printer is equipped with an installation detecting section so that once replaceable units, e.g., image forming units and toner cartridges are replaced, a check is made to determine whether the replaceable unit has been properly attached and a variety of items of information including the type of the replaceable unit are obtained. The installation detecting section takes the form of, for example, a circuit board on which a memory is mounted. The circuit board is mounted on the replaceable unit by inserting into a pocket formed in the replaceable unit. One such apparatus is disclosed in Japanese Patent Application Laid-Open No. 2007-271895.

However, the prior art apparatus incorporates a pocket portion with a rib, which prevents a circuit board from being pulled out easily. The user is required to insert the circuit board into the pocket by deforming the rib. This leads to an inefficient mounting operation of the circuit board.

SUMMARY OF THE INVENTION

An object of the invention is to solve the drawbacks of the prior art apparatus and to provide a replaceable unit that simplifies and improves the installation of an installation detecting board.

A replaceable unit is removably inserted into an apparatus. An installation detecting board has a first edge, a second edge, a third edge, and a fourth edge. The first edge is located on a side of the installation detecting board opposite the second edge. The third edge is located on a side of the installation detecting board opposite the fourth edge. The replaceable unit has a body in which a first positioning portion and a second positioning portion are formed. The first and second positioning portions are aligned in a first direction such that the first positioning portion abuts the first edge and the second positioning portion abuts the second edge. A retainer is mounted on the body, and abuts at least one of the third edge and the fourth edge to prevent the installation detecting board from moving relative to the body.

A method for mounting a circuit board into a recess formed in a replaceable unit, the circuit board including a first edge, a second edge, a third edge, a fourth edge, and electronic components mounted thereon, the method comprising:

inserting the circuit board into the recess with the first edge and the second edge abutting first and second positioning portions, respectively, formed in a perimeter portion of the recess; and inserting the circuit board further into the recess in a direction substantially perpendicular to a direction in which the first and second positioning portion aligned, the circuit board being inserted until the third edge enters under a third positioning portion formed in a perimeter portion of the recess;

mounting a retainer into the recess such that the retainer abuts the fourth edge and a portion of a major surface the circuit board in the vicinity of the fourth edge is under the retainer.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limiting the present invention, and wherein:

FIG. 5 is a transparent view of the toner cartridge;

FIG. 6 is a first perspective view of the toner cartridge;

DETAILED DESCRIPTION OF THE INVENTION

Embodiments of the present invention will be described in detail with reference to the accompanying drawings. An image forming apparatus according to the present invention will be described in terms of an electrophotographic color printer.

First Embodiment

Figure 2:
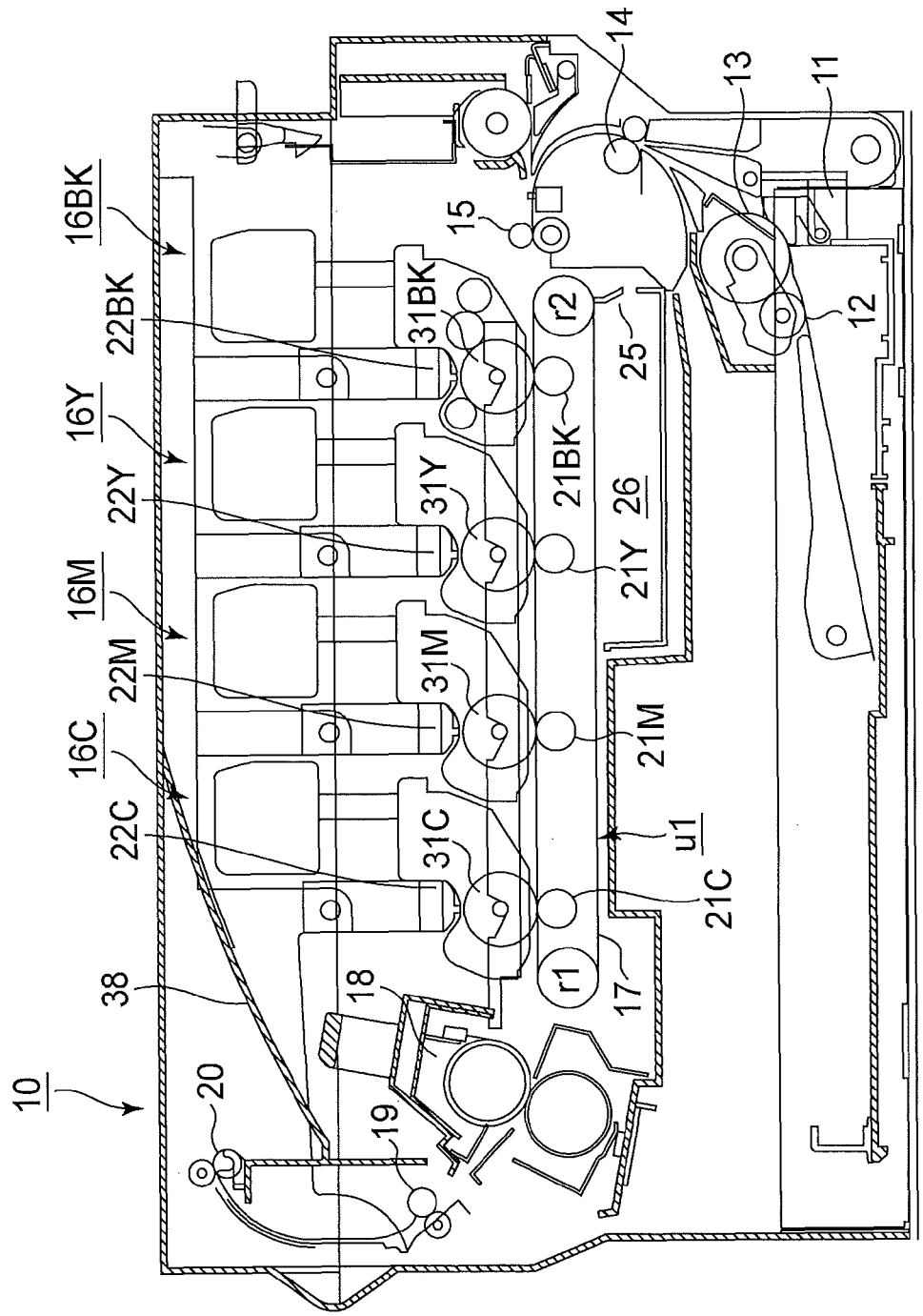
FIG. 2 illustrates the outline of a printer according to a first embodiment.

FIG. 2 illustrates the outline of a printer 10 according to a first embodiment.

A paper cassette 11 is located at a lower portion of the printer 10, and holds a stack of paper (not shown) therein. A paper feeding mechanism is disposed adjacent the exit of the paper cassette 11, and feeds the paper on a sheet-by-sheet basis. The paper feeding mechanism includes a hopping roller 12 and a retarding roller 13. The paper fed by the paper feeding mechanism advances to a first transport roller 14 disposed above the paper feeding mechanism, the transport roller 14 further transporting the paper to a second transport roller 15. The second roller 15 corrects skew of the paper. The paper then advances through image forming units 16BK, 16Y, 16M, and 16C in this order. The image forming units are first replaceable units detachably attached to the printer 10, and form black, yellow, magenta, and cyan images, respectively.

The image forming units 16BK, 16Y, 16M, and 16C include image bearing bodies or photoconductive drums 31BK, 31Y, 31M, and 31C and exposing units or light emitting diode (LED) heads 22BK, 22Y, 22M, and 22C disposed in the vicinity of corresponding photoconductive drums 31BK, 31Y, 31M, and 31C, respectively. The LED 22BK, 22Y, 22M, and 22C illuminate the charged surfaces of the corresponding photoconductive drums 31BK, 31Y, 31M, and 31C, respectively, to form electrostatic latent images thereon.

The image forming units 16BK, 16Y, 16M, and 16C are aligned along the transfer belt 17 of a transfer unit U1. The transfer unit U1 includes a first roller or a drive roller r1, a second roller or a driven roller r2, and the transfer belt 17. The transfer belt is disposed about the drive roller r1 and driven roller r2. The transfer belt 17 is sandwiched between the photoconductive drums 31BK, 31Y, 31M, and 31C and the transfer rollers 21BK, 21Y, 21M, and 21C. The transfer rollers receive a predetermined voltage from a transfer power supply (not shown).

The paper is carried on the transfer belt 17. As the transfer belt 17 runs, the paper advances through the transfer points defined between the photoconductive drums 30BK, 30Y, 30M, and 30C and the corresponding transfer rollers 21BK, 21Y, 21M, and 21C, respectively, so that toner images of corresponding colors are transferred onto the paper one over the other in registration to form a full color toner image on the paper.

Next, the paper advances to a fixing unit 18 or fixing apparatus where the black, yellow, magenta, and cyan toner images on the paper are fixed into a full color image. The paper then leaves the fixing unit 18, and is further transported by a third transport roller 19 to a discharge roller 20, which in turn discharges the paper onto a stacker 38.

A cleaning blade 25 scrapes the residual toner that remains on the transfer belt 17. The scraped toner is collected into a waste toner box 26.

Next, the image forming units 16BK, 16Y, 16M, and 16C will be described. Each of the image forming units 16BK, 16Y, 16M, and 16C may be substantially identical; for simplicity only the operation of the image forming unit 16BK for forming black images will be described, it being understood that the other image forming units 16Y, 16M, and 16C may work in a similar fashion.

Figure 3:
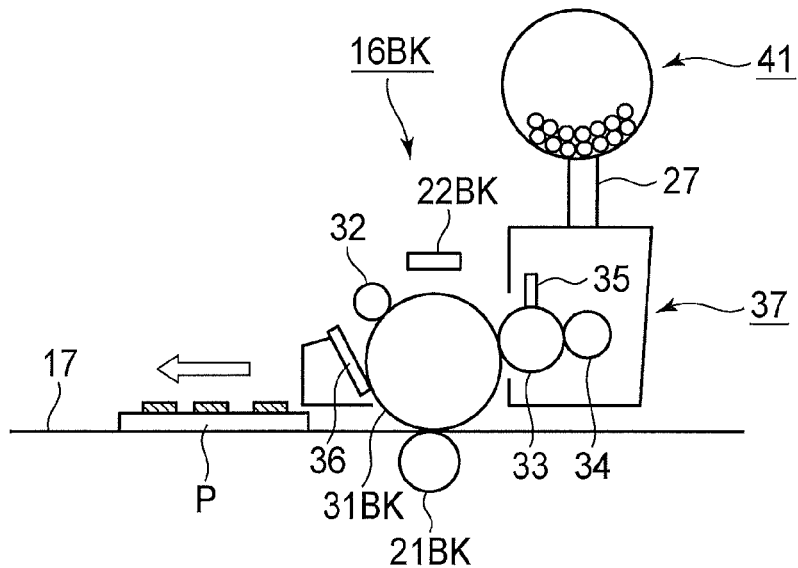
FIG. 3 illustrates the outline of an image forming unit according to the first embodiment.

FIG. 3 illustrates the outline of the image unit 16BK according to the first embodiment.

A toner cartridge 41 is disposed on a body of the image forming unit 16BK. The black toner held in the toner cartridge 41 is supplied into the image forming unit 16BK through a toner supplying path 27. The toner cartridge 41 is a replaceable component, and is therefore detachably attached to the body 37.

A photoconductive drum 31BK is formed of a photoconductive body capable of holding charges on its surface. When the charged surface of the photoconductive drum 31BK is selectively irradiated with light in accordance with image data, the charges in irradiated areas are dissipated. Disposed around the photoconductive drum 31BK are a charging roller 32, a developing roller 33, a toner supplying roller 34, and a cleaning blade 36.

The charging roller 32 is in contact with the photoconductive drum 31BK, and rotates in a direction opposite to the direction in which the photoconductive drum 31BK rotates. When the charging roller 32 rotates, it receives a high voltage from a charging power supply (not shown) and uniformly charges the surface of the photoconductive drum 31BK. The developing roller 33 is in contact with the photoconductive drum. 31BK, and rotates in a direction opposite to the direction in which the photoconductive drum 31BK rotates. The developing roller 33 receives a high voltage from a developing power supply (not shown), and supplies the black toner to the electrostatic latent image formed on the photoconductive drum 31BK. The toner supplying roller 34 is in pressure contact with the developing roller 33, and rotates in the same direction as the developing roller 33. The toner supplying roller 34 is configured to rotate freely. The toner supplying roller 34 receives a high voltage from a developer supplying power supply (not shown), and supplies the toner received from the toner cartridge 41 to the developing roller 33. The developing blade 35 forms a thin layer of toner on the surface of the developing roller 33. The cleaning blade 36 scrapes the residual toner, which remains on the photoconductive drum after the transferring of the black toner image onto the paper, off the photoconductive drum 31BK.

The printer 10 according to the present invention is a single component development printer and uses a non-magnetic single component developer material.

The charging roller 32 uniformly charges the surface of the photoconductive drum 31BK, and the LED head 22BK illuminates the charged surface of the photoconductive drum 31BK in accordance with the image data to form an electrostatic latent image on the photoconductive drum 31BK. The supplying roller 34 supplies the black toner, which has been supplied from the toner cartridge 41 through the toner supplying path 27, to the developing roller 34, thereby developing the electrostatic latent image into a black toner image.

The toner cartridge 41 is detachably attached to the body 37 of the image forming unit.

A description will be given of how the toner cartridge 41 is attached to or detached from the body 37.

Figure 4:
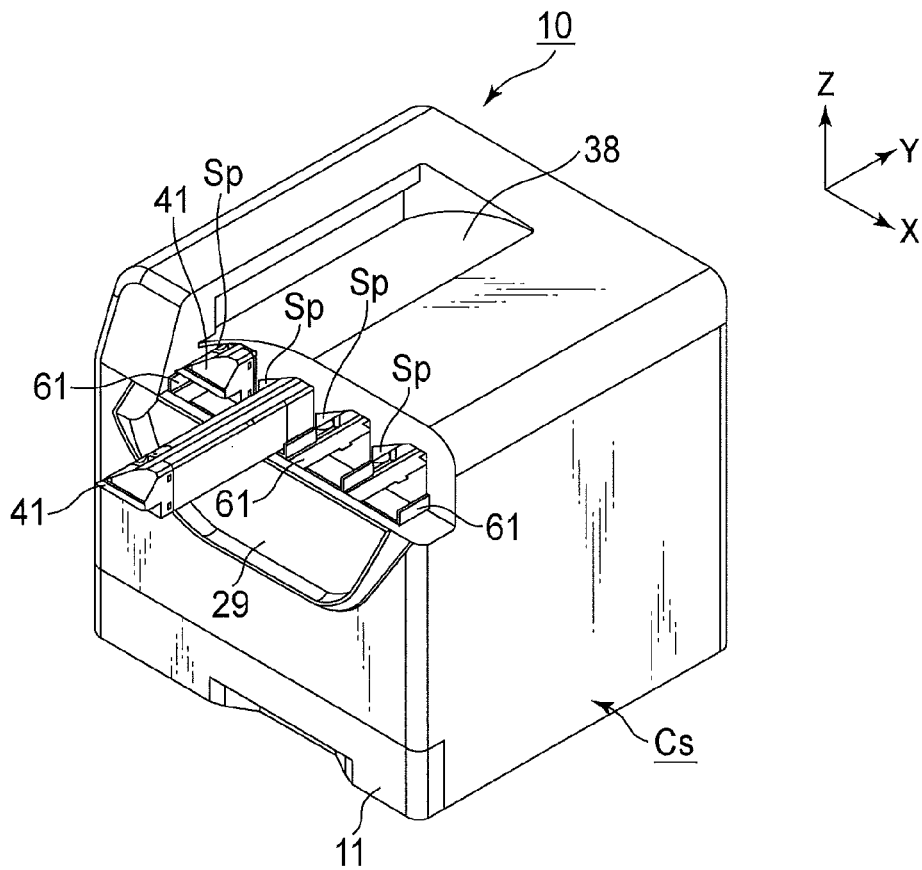
FIG. 4 is a perspective view of the printer.

FIG. 4 is a perspective view of the printer 10.

A front cover 29 is swingably mounted to a chassis Cs of the printer 10. The stacker 38 is formed on the top of the chassis Cs.

The image forming units 16BK, 16Y, 16M, and 16C are located in the body of the printer 10. The toner cartridges 41 are inserted into corresponding receiving spaces Sp generally in the shape of a triangular prism. Once the front cover 29 is opened, the user is allowed to insert or pull out the toner cartridge 41 through the receiving spaces Sp.

A toner cartridge supporting unit 61 is disposed at the bottom of the receiving space Sp, and supports the toner cartridge 41 inserted into the printer 10. The toner cartridge supporting unit 61 is mounted to the printer 10 by means of, for example, screws, so that the toner cartridge 41 may be inserted into or pulled out of the printer 10 while sliding on the toner cartridge supporting unit 61.

In the following description, "Y" indicates a direction parallel to the longitudinal direction of the toner cartridge 41, and is a direction in which the toner cartridge 41 is inserted into and pulled out of the printer 10. "X" indicates a direction parallel to the width of the toner cartridge 41, and is perpendicular to the Y-direction. "Z" indicates a direction perpendicular to the Y- and X-directions.

Next, a description will be given of a second replaceable unit assembly consisting of the toner cartridge 41 and toner cartridge supporting unit 61.

Figure 7:
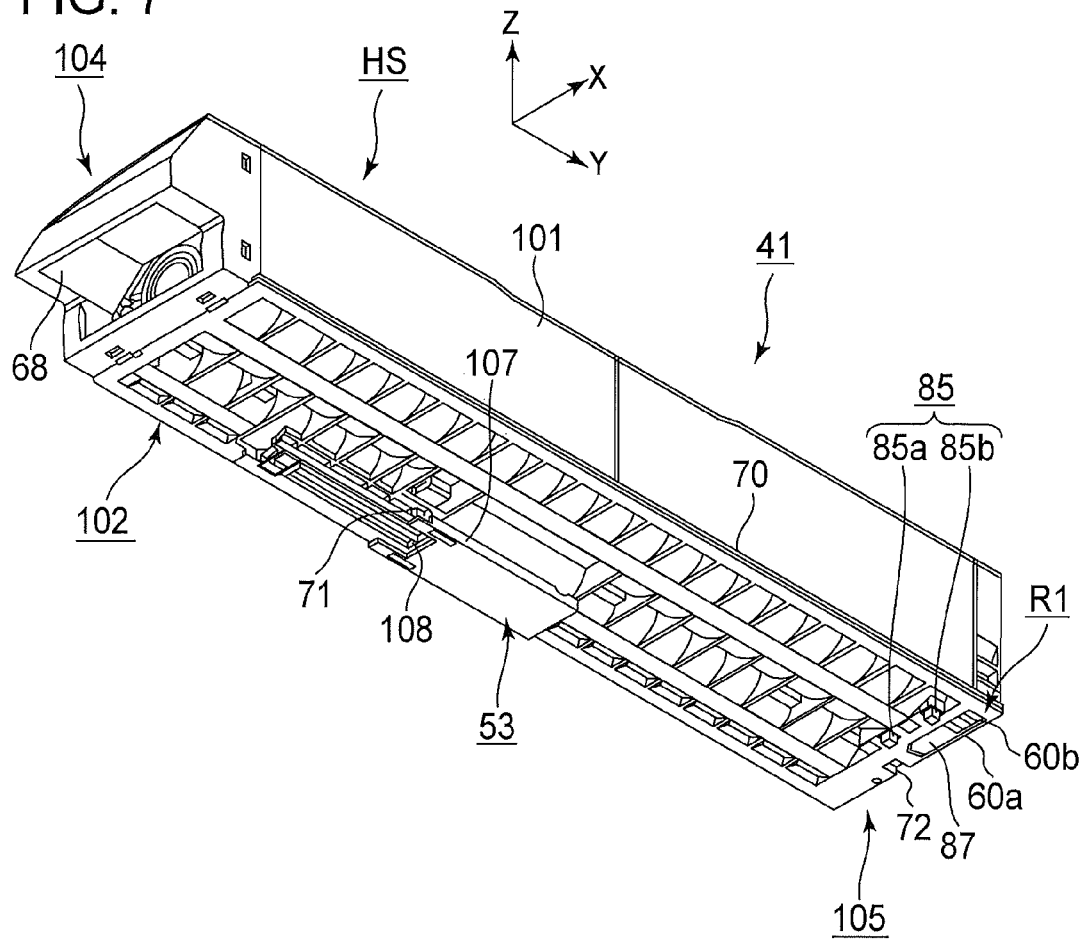
FIG. 7 is a second perspective view of the toner cartridge.
Figure 8:
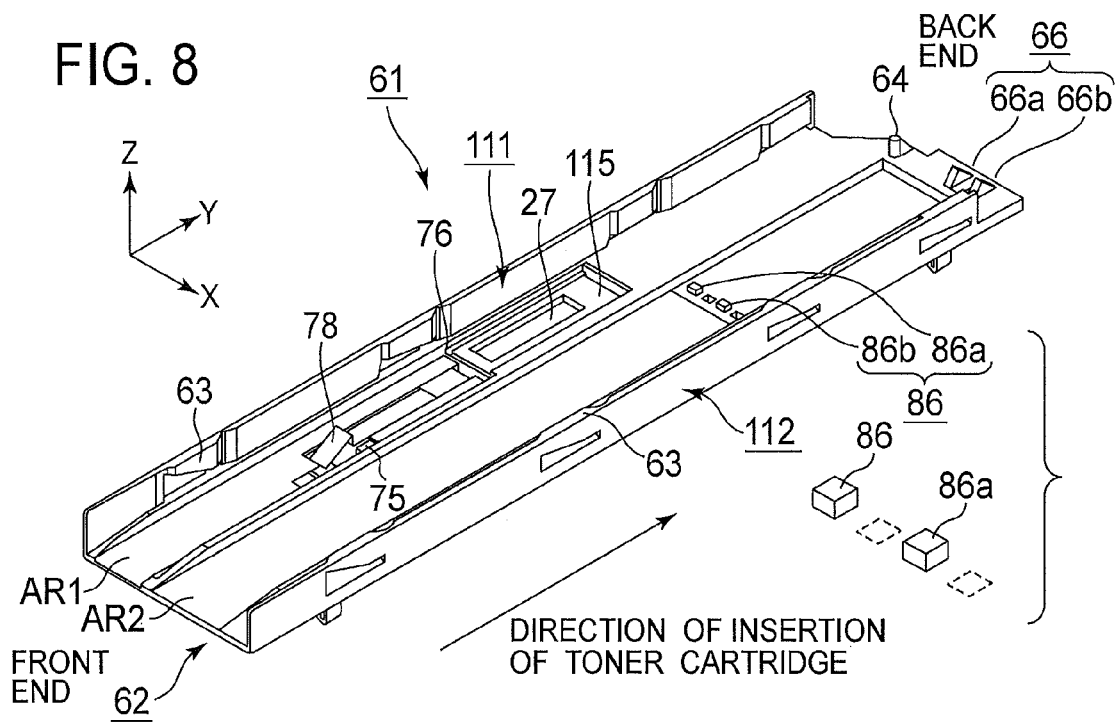
FIG. 8 is a first perspective view of a toner cartridge supporting unit.
Figure 9:
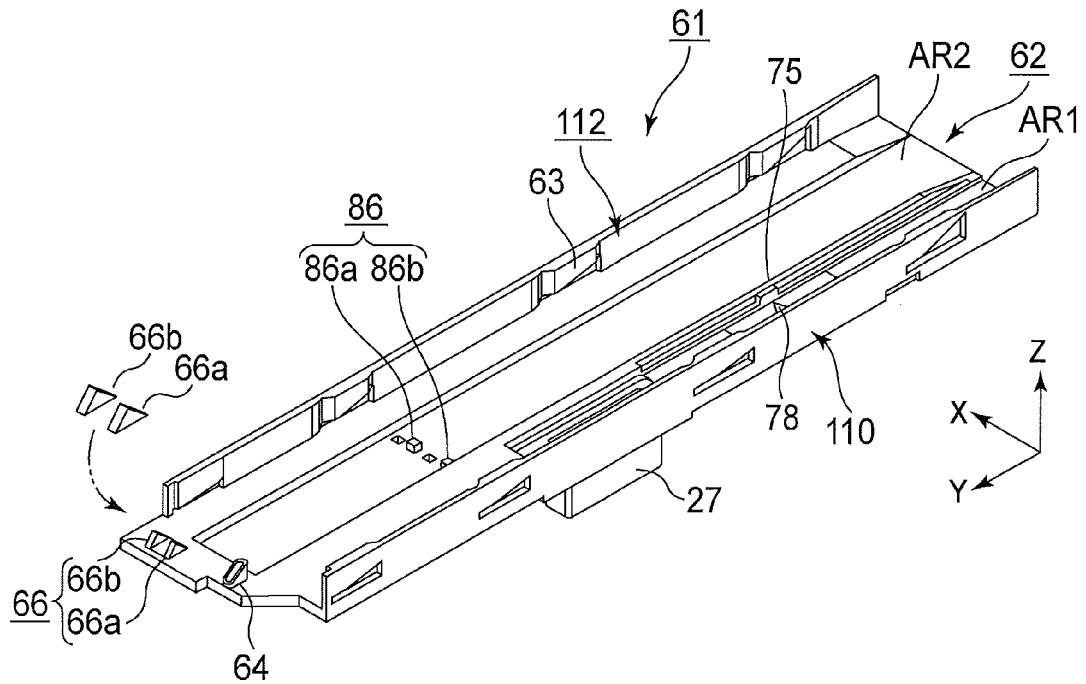
FIG. 9 is a second perspective view of the toner cartridge supporting unit.
Figure 10:
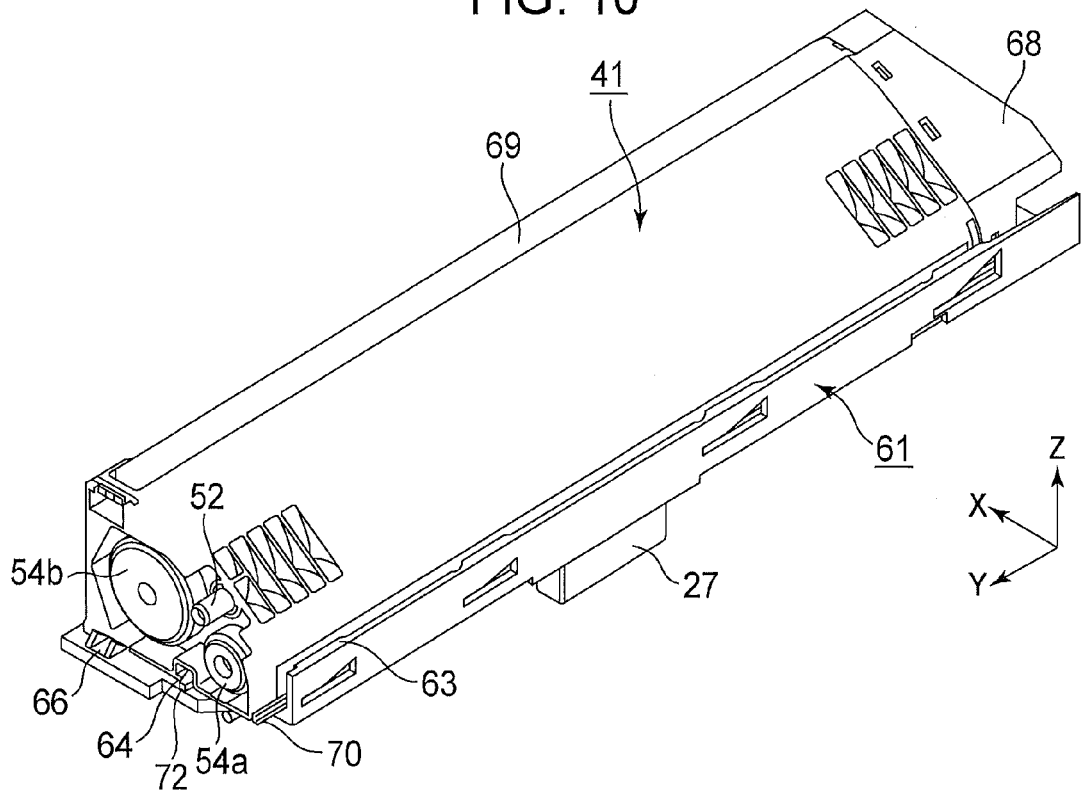
FIG. 10 is a first perspective view of the toner cartridge and toner cartridge supporting unit when the toner cartridge has been supported on the toner cartridge supporting unit.
Figure 11:
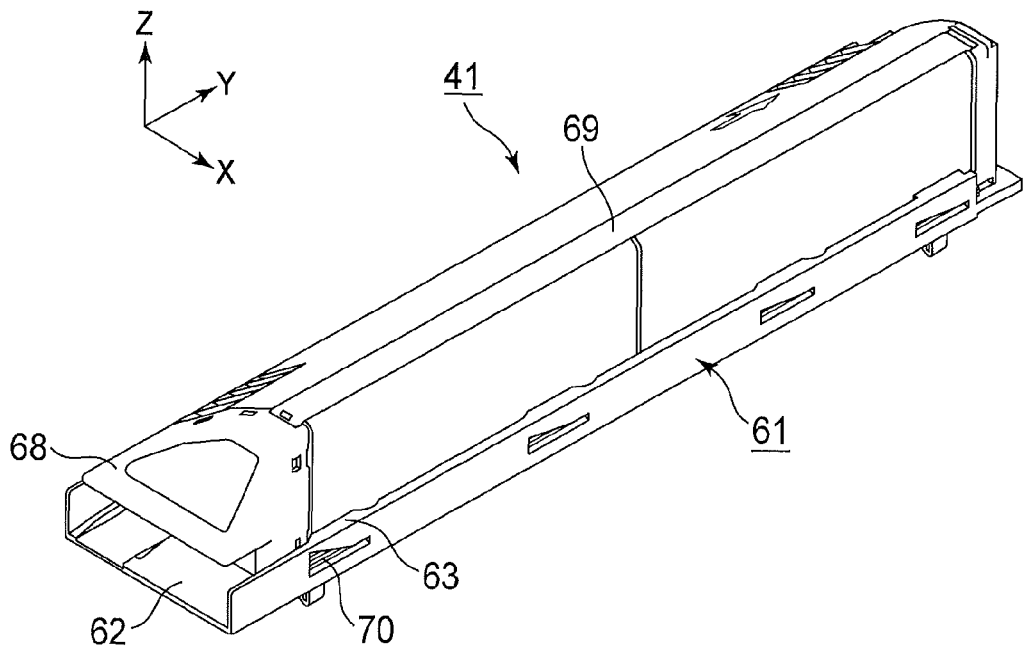
FIG. 11 is a second perspective view of the toner cartridge and toner cartridge supporting unit when the toner cartridge has been supported on the toner cartridge supporting unit.

FIG. 5 is a transparent view of the toner cartridge 41. FIG. 6 is a first perspective view of the toner cartridge 41. FIG. 7 is a second perspective view of the toner cartridge 41. FIG. 8 is a first perspective view of the toner cartridge supporting unit 61. FIG. 9 is a second perspective view of the toner cartridge supporting unit 61. FIG. 10 is a first perspective view of the toner cartridge and toner cartridge supporting unit 61 when the toner cartridge 41 has been supported on the toner cartridge supporting unit 61. FIG. 11 is a second perspective view of the toner cartridge 41 and toner cartridge supporting unit 61 when the toner cartridge 41 has been supported on the toner cartridge supporting unit 61.

The toner cartridge 41 will be described.

Referring to FIGS. 5-7, the toner cartridge 41 longitudinally extends in the Y-direction, and has a housing Hs generally in the shape of a triangular prism. A side wall 101 or a first wall extends in the Z-direction and in the Y-direction, and a bottom wall 102 or a second wall also extends in the Y-direction. The toner cartridge 41 also includes a back side wall 104 or a fourth wall located at one longitudinal end of the toner cartridge 41 and a front side wall 105 or a fifth wall located at the other longitudinal end of the toner cartridge 41. An inclined side wall 103 or a third wall extends across the side wall 101 and the bottom wall 102, and meets the front side wall 105 and the back side wall 104.

The housing Hs has a toner chamber 51 that holds the toner as a developer material therein. The toner chamber 51 incorporates a spiral 56 and an agitator 55 that extends in the longitudinal direction of the toner cartridge 41. When the agitator 55 is driven in rotation, the agitator 55 agitates the toner in the toner chamber 51.

The toner in the toner chamber 51 is discharged through a toner discharge opening 59 into the toner supplying path 27. A shutter 53 is attached to the bottom wall 102 of the toner cartridge 41 and is configured to slide in the longitudinal direction (Y-direction) of the toner cartridge 41 so that the shutter 53 opens and closes the toner discharge opening 59.

A first latch 71 (FIG. 32) is mounted on the toner cartridge 41 and is located closer to the back side wall 104 than the toner discharge opening 59. The first latch 71 is formed of a resilient material. When the toner cartridge 41 is inserted into the receiving space Sp of the printer 10 so that the first latch 71 disengages from a first engagement portion 107 (FIG. 32) of the shutter 53 (FIG. 32), the first latch 71 allows the shutter 53 to slide to open the toner discharge opening 59.

The shutter 53 includes a second engagement portion 108 (FIG. 36) located at its portion closest to the back side wall 104. When the toner cartridge 41 is pulled out of the receiving space Sp, the second engagement portion 108 engages the second latch 78 (FIG. 32) to prevent the shutter 53 from sliding any further toward the back side wall 104. Thus, as the toner cartridge 41 is further pulled out, the shutter slides relative to the toner cartridge 41 toward the front side wall 105 to close the toner discharge opening 59.

The toner cartridge 41 includes ribs 70 formed at widthwise ends of the bottom of the toner cartridge 41, the ribs 70 extending in the longitudinal direction of the toner cartridge 41. The ribs 70 guide the toner cartridge 41 as it is inserted or pulled out relative to the toner cartridge supporting unit 61.

The toner cartridge 41 includes an installation detecting board 60 (FIG. 1) mounted on the outer surface of the bottom wall 102. The installation detecting board 60 determines whether the toner cartridge 41 has been attached properly to the body of the printer 10, and holds the type of the toner cartridge 41 and other information so that the information held in the installation detecting board 60 may be read by the image forming unit. The toner cartridge 41 has a mounting surface R1 on which the installation detecting board 60 and a retainer 87 are mounted. The mounting surface R1 is formed on a part of the bottom wall 102 of the toner cartridge 41 in the vicinity of the side wall 101 and the front side wall 105. The installation detecting board 60 and the retainer 87 are disposed on the mounting surface R1.

The installation detecting board 60 has a memory 152 (FIG. 20A) as a memory element mounted thereon and a contact 60*a* as a first connection terminal and a second contact 60*b* as a second connection terminal. The memory 152 is, for example, a non-volatile memory that holds information about the type of the toner cartridge 41 and other variables and the information used in determining whether the toner cartridge 41 has been properly attached to the image forming unit. The information held in the memory 152 includes information about consumable items, for example, the amount, color, and properties of the toner held in the toner cartridge 41.

An insertion limiter 85 or a first limiting element includes limiting projections 85*a* and 85*b* which are adjacent to the mounting surface R1. The limiting projections 85*a* and 85*b* are small projections disposed at two of a total of four predetermined positions on the outer surface of the bottom wall 102. The insertion limiter 85 is used for preventing the wrong toner cartridge 41 from being inserted mistakenly.

A handle 69 extends in the Y-direction, and is located at the uppermost part of the inclined side wall 103. When the user handles or carries the toner cartridge 41, he grips the handle 69. A handhold 68 is formed at the back side wall 104, and is held by the user when the user pulls the toner cartridge 41 out of the receiving space Sp.

Gears 54*a* and 54*b* are rotatably mounted on the front side wall 105. When a drive gear 57 enters the toner cartridge 41, the drive gear 57 moves into a meshing engagement with the gears 54*a* and 54*b* so that the drive gear 57 drives the gears 54*a* and 54*b* in rotation. The spiral 56 has one longitudinal end thereof connected to the gear 54*a*. The agitator 55 has one longitudinal end thereof connected to the gear 54*b*.

The front side wall 105 has a positioning post 52 formed as a first positioning post on the toner cartridge side. When the toner cartridge 41 is inserted into the receiving space Sp, the positioning post 52 enters a positioning hole h11 (FIGS. 16A and 16B) formed in the surface S1 of the gear 57, the positioning hole h11 being concentric to the drive gear 57 and serving as a first positioning member. Thus, the positioning post 52 and the positioning hole h11 serve to position the toner cartridge 41 relative to the printer 10. A limiting groove 72 as a second positioning member is formed in the bottom wall 102 near the lower end of the front side wall 105. The limiting groove 72 engages a positioning projection 64 formed on the toner cartridge supporting unit 61, thereby positioning the toner cartridge 41 relative to the printer 10 and preventing the toner cartridge 41 from rotating when the gear 54a is rotated by the drive gear 57.

The toner cartridge supporting unit 61 will be described.

Referring to FIGS. 8 and 9, the toner cartridge supporting unit 61 includes a supporting surface 62 on which the toner cartridge 41 is supported, and guides 111 and 112 that rise from the supporting surface 62 and extends in the longitudinal direction of the toner cartridge supporting unit 61. Four slide guides 63 are formed on each of the guides 111 and 112, and project inwardly to guide the toner cartridge 41 in such a way that the ribs 70 of the toner cartridge 41 smoothly slide on the slide guides 63 when the toner cartridge 41 is inserted into or pulled out of the toner cartridge supporting unit 61.

A recess AR1 is formed in the supporting surface 62 and extends in the longitudinal direction of the toner cartridge supporting unit 61. When the toner cartridge 41 is inserted into or pulled out of the receiving space Sp or when the shutter 53 opens or closes the toner discharge opening 59, the recess AR1 prevents the shutter 53 from interfering with the supporting surface 62. Another recess AR2 is formed adjacent the recess AR1. When the toner cartridge 41 is inserted into or pulled out of the receiving space Sp, the recess AR2 prevents the limiting projections 85a and 85b from interfering with the supporting surface 62. The AR1 is deeper than the thickness of the shutter 53. The recess AR2 is slightly deeper than the height of the limiting projections 85a and 85b.

A toner guiding port 115 is formed in the longitudinal midpoint of the recess AR1, so that the toner in the toner chamber 51 is discharged through the toner guiding port 115. A shutter movement limiting element 76 is formed adjacent the toner guiding port 115, and is closer to the inlet of the receiving space Sp, and projects upwardly or perpendicularly from the supporting surface 62. When the toner cartridge 41 is inserted into the receiving space Sp and the shutter 53 arrives at the toner guiding port 115, the shutter movement limiting element 76 (FIGS. 37 and 38) abuts the shutter 53, thereby preventing the shutter 53 from moving further into the receiving space Sp and then causing the shutter 53 to open the opening 59.

The second latch 78 (FIGS. 32-35) is located adjacent the shutter movement limiting element 76 and is closer to the inlet of the receiving space Sp than the shutter movement limiting element 76. The second latch 78 is formed of a resilient material. When the toner cartridge 41 is inserted into the receiving space Sp, the second latch 78 restrains movement of the shutter 53 relative to the toner discharge opening 59, so that the shutter 53 opens the toner discharge opening 59. When the toner cartridge 41 is pulled out of the receiving space SP, the second latch 78 restrains movement of the shutter 53 toward the back side wall 104 so that the shutter 53 closes the toner discharge opening 59.

A latch releasing post 75 (FIG. 32-35) is located adjacent the second latch 78. As the toner cartridge 41 moves into the receiving space Sp the latch releasing post 75 pushes up the first latch 71, allowing the shutter 53 to move relative to the bottom wall 102 of the toner cartridge 41. Thus, the shutter 53 can open the toner discharge opening 59.

The positioning projection 64 is disposed between the recesses AR1 and AR2 at the back end of the toner cartridge supporting unit 61 on a side of the toner cartridge supporting unit 61 opposite the inlet of the receiving space Sp. When the toner cartridge 41 has been inserted completely into the receiving space Sp, the positioning projection 64 is in engagement with the limiting groove 72, thereby positioning the toner cartridge 41 relative to the printer 10. The positioning projection 64 also serves to prevent the toner cartridge 41 from being rotated when the drive force of the drive gear 57 is transmitted to the gear 54a.

Contacts 66 includes a first contact 66a and a second contact 66b, and are formed on the recess AR2 near the positioning projection 64 at a location that faces the mounting surface R1 of the toner cartridge 41. The contacts 66 is at the back end portion of the toner cartridge supporting unit 61 on a side of the toner cartridge supporting unit 61 opposite the inlet of the receiving space Sp. The first contact 66a and second contact 66b are formed of an elastic material and are in the shape of a short triangular prism. When the toner cartridge 41 has been completely inserted into the receiving space Sp, the first contact 66a and second contact 66b are pressed against the contact 60a and contact 60b, respectively, under predetermined pressure. The contact areas of the first contact 66a and second contact 66b are gold-plated for good electrical contact with the first contact 60a and the second contact 60b, respectively.

Insertion limiters 86 including limiting projections 86a and 86b are located at a position on the recess AR2 closer to the back end of the toner cartridge supporting unit 61 than the longitudinal midpoint (Y-direction). The limiting projections 86a and 86b cooperate with the limiting projections 85a and 85b to prevent the wrong toner cartridge 41 from being inserted to the body of the wrong image forming unit. The limiting projections 86 includes two projections 86a and 86b located at two positions of four predetermined positions, and project from the recess AR2. For example, in the present embodiment, the limiting projections 85a and 85b are disposed at positions different from the limiting projections 86a and 86b, so that when the toner cartridge 41 is inserted into the receiving space Sp, the limiting projections 85a and 85b can advance without interfering with the limiting projections 86a and 86b.

When the toner cartridge 41 has been completely inserted into the receiving space Sp as shown in FIGS. 10 and 11, the positioning projection 64 formed on the toner cartridge supporting unit 61 fits into the groove 72 formed in the toner cartridge 41, so that the toner cartridge 41 is placed in position and is prevented from being rotated when the rotation of the drive gear 57 is transmitted to the gear 54a.

Once the contacts 66 moves into electrical contact with the first and second contacts 60a and 60b of the installation detecting board 60, electronic communication is possible between the controller on the printer side and the toner cartridge 41 through the installation detecting board 60. The controller (not shown) reads the information from the memory 152, and determines based on the information whether the toner cartridge 41 is attached properly to the body of the image forming unit, and obtains other information including the type of the toner cartridge 41.

Additionally, the positioning post 52 enters the positioning hole h11 formed in the surface S1 of the drive gear 57, thereby positioning the toner cartridge 41 relative to the printer 10.

A description will be given of how the drive gear 57 meshes with the gears 54a and 54b when the toner cartridge 41 is inserted into the receiving space Sp.

Figure 12:
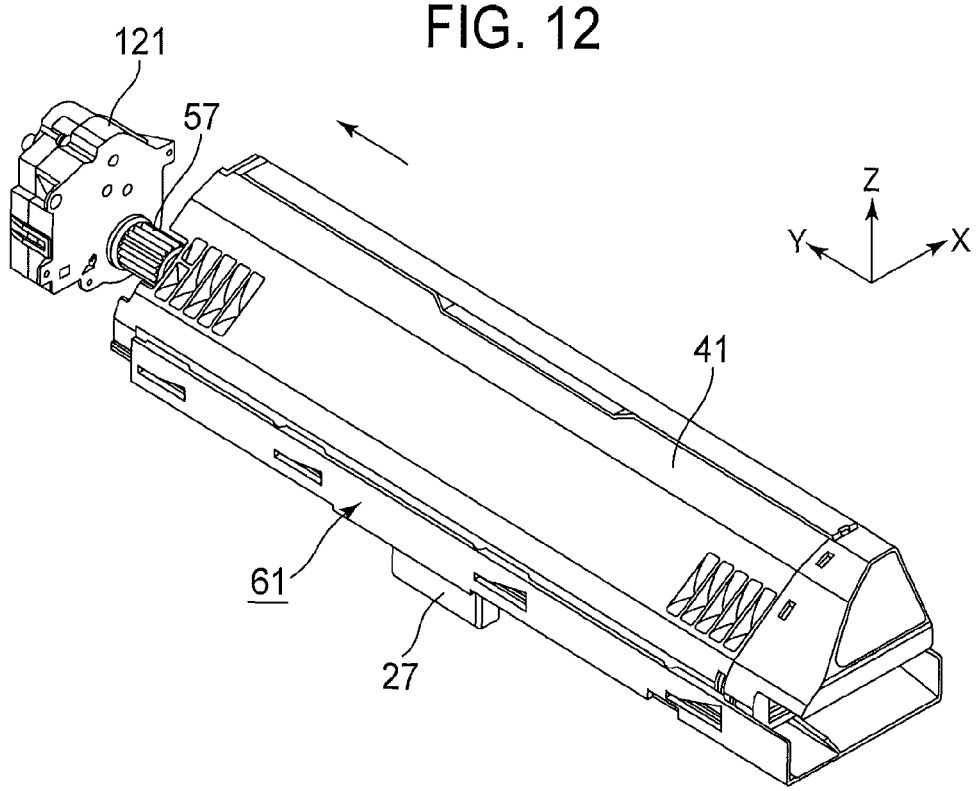
FIG. 12 is a first perspective view illustrating the toner cartridge and the toner cartridge supporting unit when the toner cartridge has been completely inserted into a receiving space.
Figure 13:
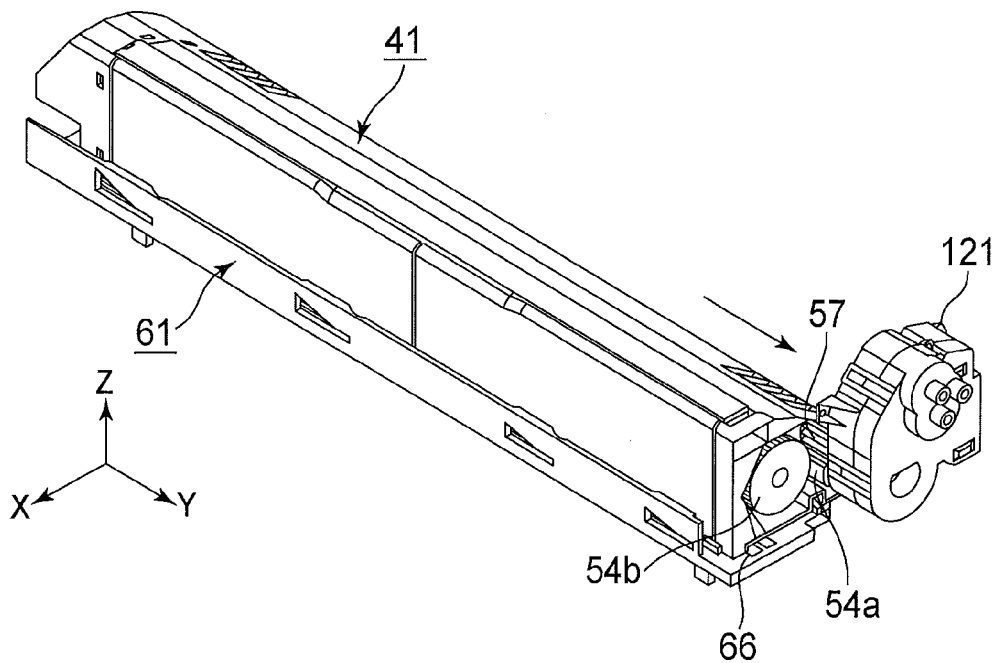
FIG. 13 is a second perspective view illustrating the toner cartridge and the toner cartridge supporting unit when the toner cartridge has been completely inserted into the receiving space.
Figure 14:
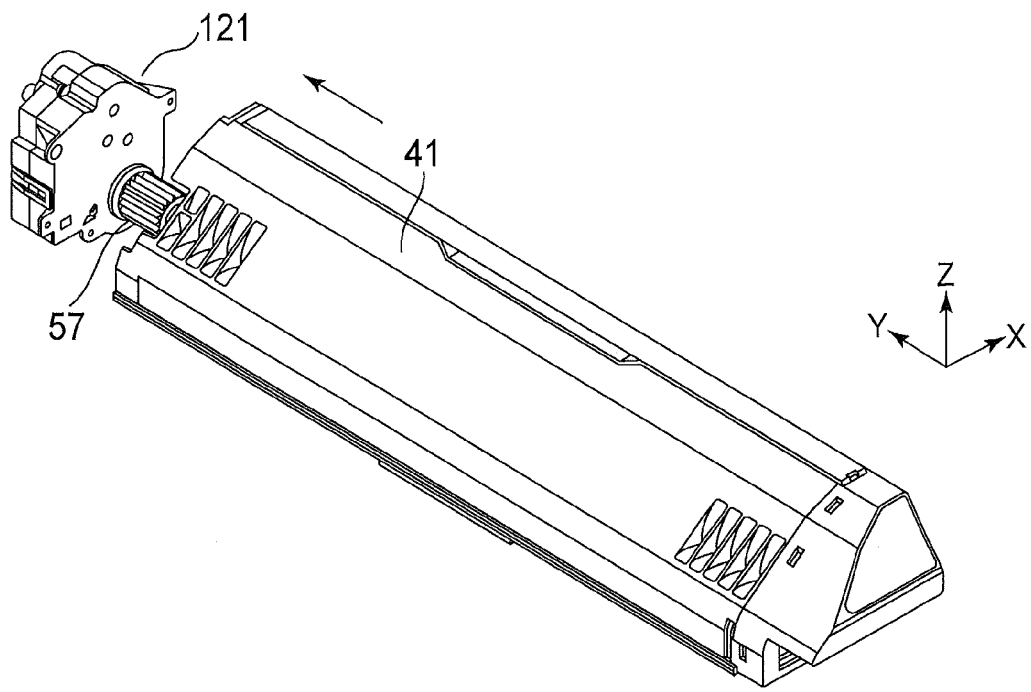
FIG. 14 is a first perspective view illustrating the toner cartridge and a drive gear when the toner cartridge is inserted into the receiving space.
Figure 15:
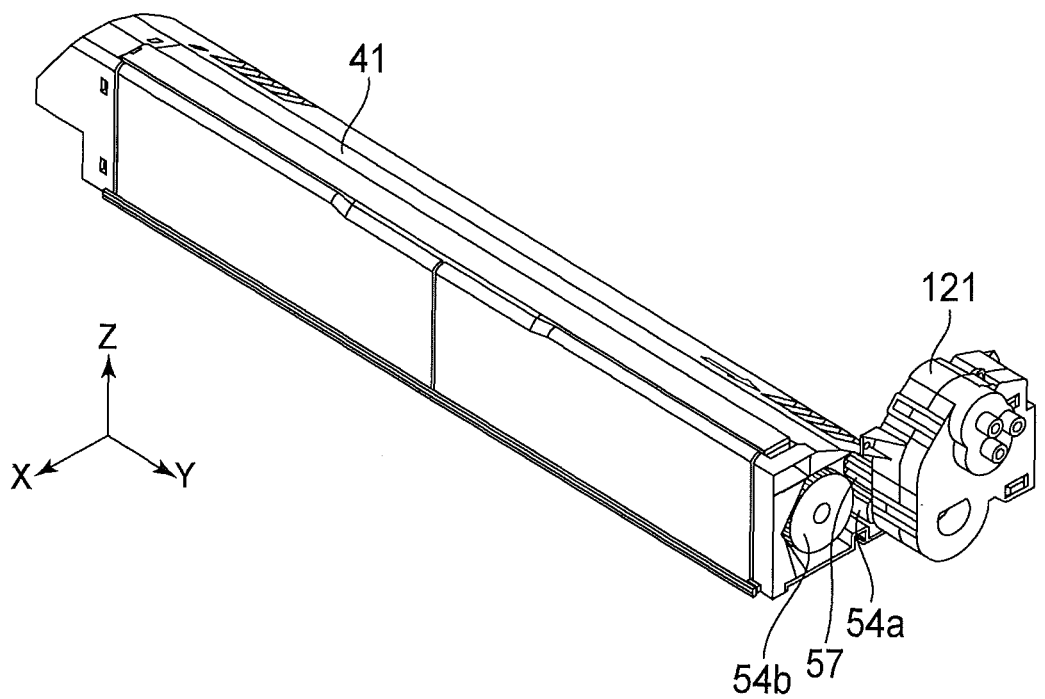
FIG. 15 is a second perspective view illustrating the toner cartridge and the drive gear of a drive source when the toner cartridge has been inserted into the receiving space.
Figure 16A:
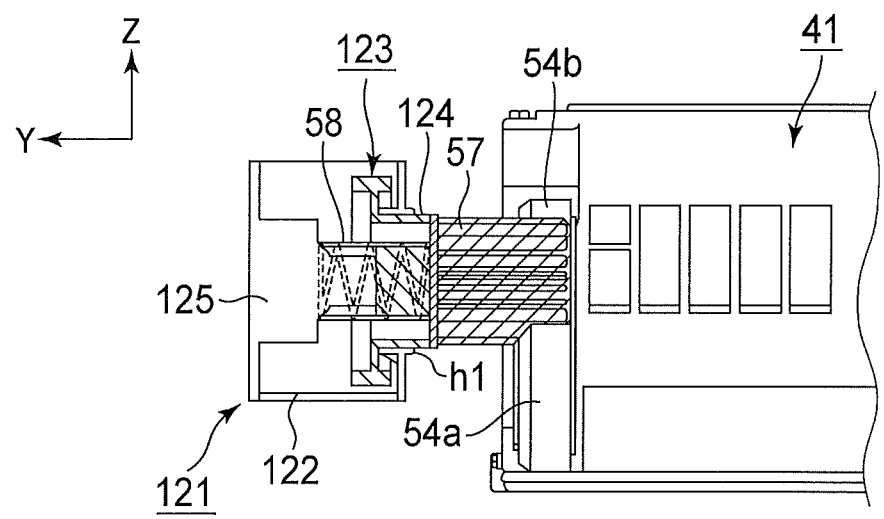
FIG. 16A illustrates the drive gear and other gears after these gears have moved into a meshing engagement with one another.
Figure 16B:
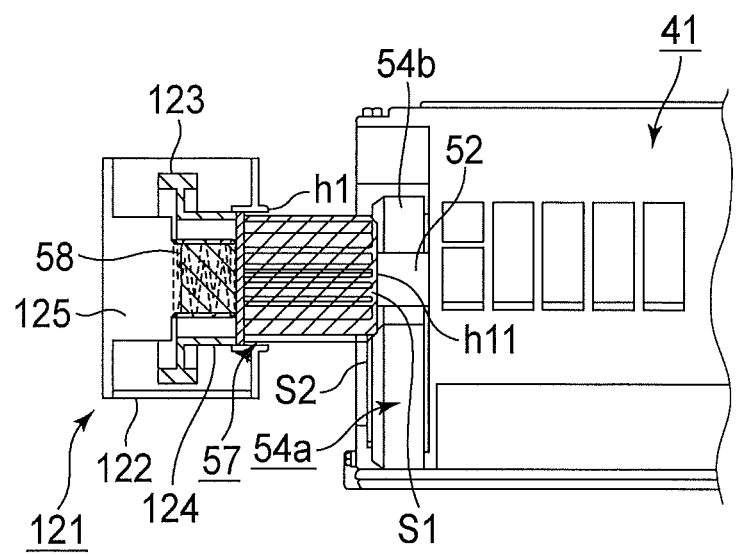
FIG. 16B illustrates the drive gear and the other gears before they have moved into meshing engagement with one another.

FIG. 12 is a first perspective view illustrating the toner cartridge 41 and the toner cartridge supporting unit 61 when the toner cartridge 41 has been completely inserted into the receiving space Sp. FIG. 13 is a second perspective view illustrating the toner cartridge 41 and the toner cartridge supporting unit 61 when the toner cartridge 41 has been completely inserted into the receiving space Sp. FIG. 14 is a first perspective view illustrating the toner cartridge 41 and the drive gear 57 when the toner cartridge 41 is inserted into the receiving space Sp. FIG. 15 is a second perspective view illustrating the toner cartridge 41 and the drive gear 57 of a drive source 121 when the toner cartridge 41 has been inserted into the receiving space Sp. FIG. 16A illustrates the drive gear 57 and gears 54a and 54b after these gears have moved into a meshing engagement with one another. FIG. 16B illustrates the drive gear 57 and gears 54a and 54b before the gears 54a and 54b have moved into a meshing engagement with one another.

The drive source 121 is disposed at the end of the receiving space Sp, and drives the spiral 56 and agitator 55 in rotation. A motor case 112 is a box-like chassis for accommodating the motor. The drive gear 57 projects outwardly of the motor case 122 through a hole h1 formed in a surface of the motor case 122 facing the toner cartridge 41, and meshes with the gears 54a and 54b.

The motor case 122 houses a cartridge motor (not shown) as a drive source for transporting and agitating the toner, an intermediate gear 123 in mesh with an output gear (not shown) mounted to the output shaft of the cartridge motor, and a spring 58. The spring 58 is located between the intermediate gear 123 and a projection 125, and urges the drive gear 57 toward the toner cartridge 41. The intermediate gear 123 includes a boss 124 in the shape of a hollow cylinder closed at an end thereof. The boss 124 has a bottom end to which the drive gear 57 is mounted.

As the toner cartridge 41 is inserted into the receiving space Sp in the direction of an arrow (FIGS. 12 and 14), the positioning post 52 enters the hole h11 formed in the surface S1 of the drive gear 57, thereby guiding the toner cartridge 41 toward its final position. As the toner cartridge 41 is further inserted, the surface S1 of the drive gear 57 may merely abut the surface S2 of the gear 54a so that the drive gear 57 will not properly engage the gear 54a and 54b, in which case the drive gear 57 and intermediate gear 123 are pushed back against the urging force of the spring 58 as shown in FIG. 16B.

When the drive gear 57 is driven into rotation, the spring 58 pushes the drive gear 57 into a meshing engagement with the gear 54a and 54b as shown in FIG. 16A. In this manner, the drive gear 57 can properly engage the toner cartridge 41. When the cartridge motor is energized, the cartridge motor drives the intermediate gear 123 in rotation, which in turn drives the drive gear 57 in rotation. Thus, the gear 54a and 54b are rotated.

The mounting surface R1 will now be described.

Figure 1:
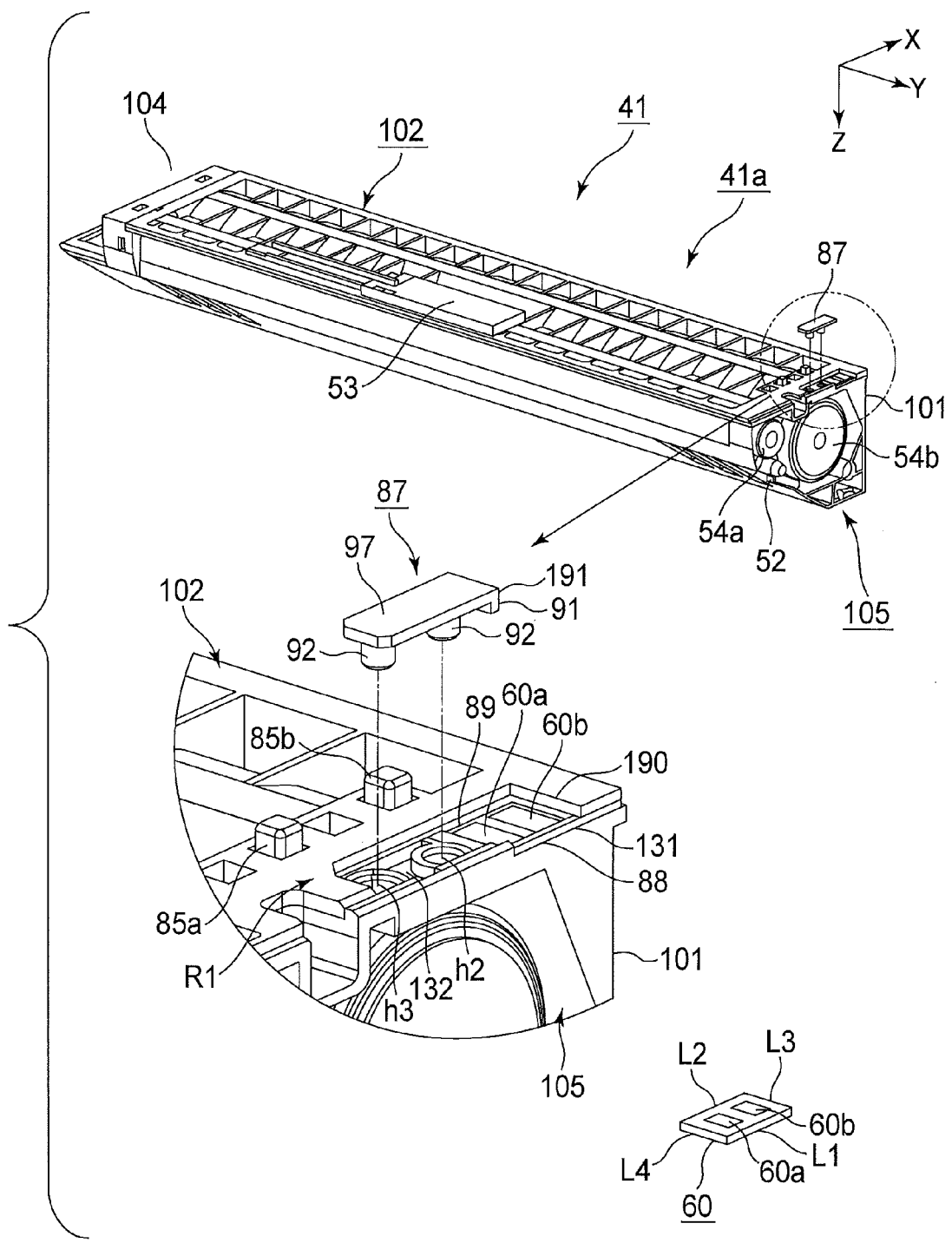
FIG. 1 illustrates how an installation detecting board is mounted on a toner cartridge.
Figure 17:
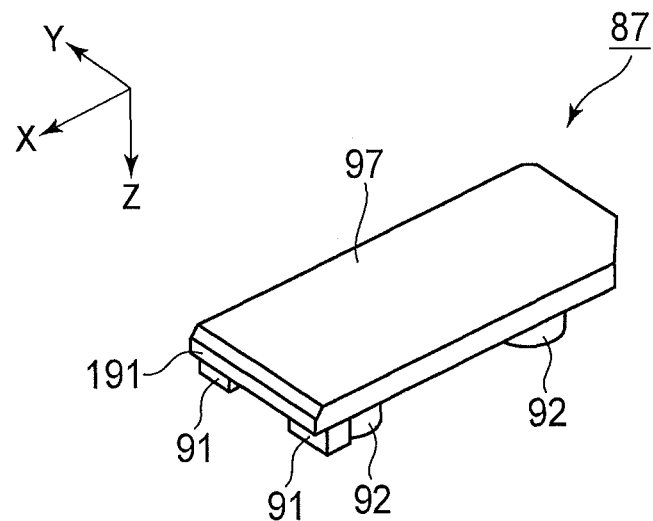
FIG. 17 is a first perspective view of a retainer according to the first embodiment.
Figure 18:
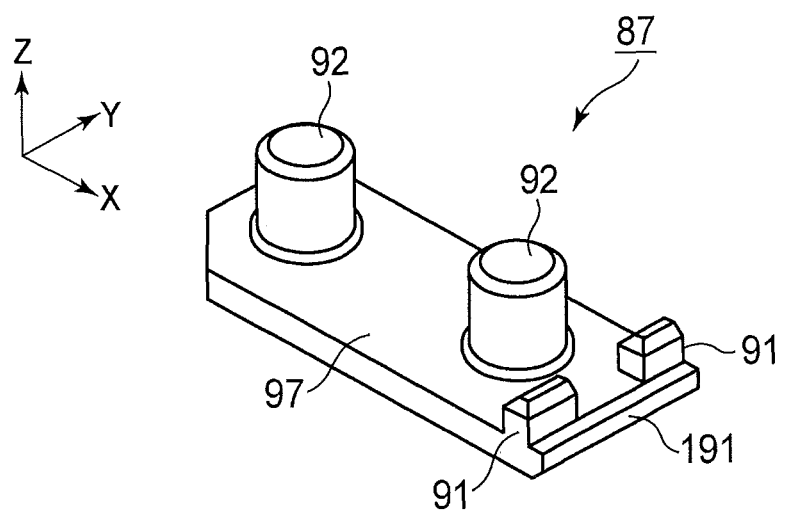
FIG. 18 is a second perspective view of the retainer.
Figure 19:
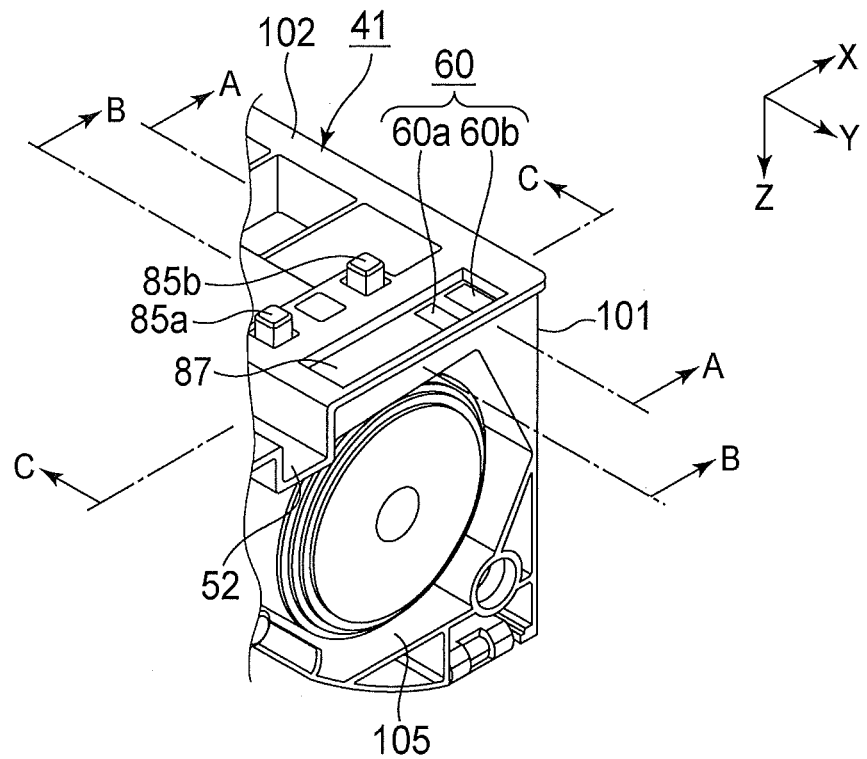
FIG. 19 illustrates the pertinent portion of the toner cartridge.
Figure 20A:
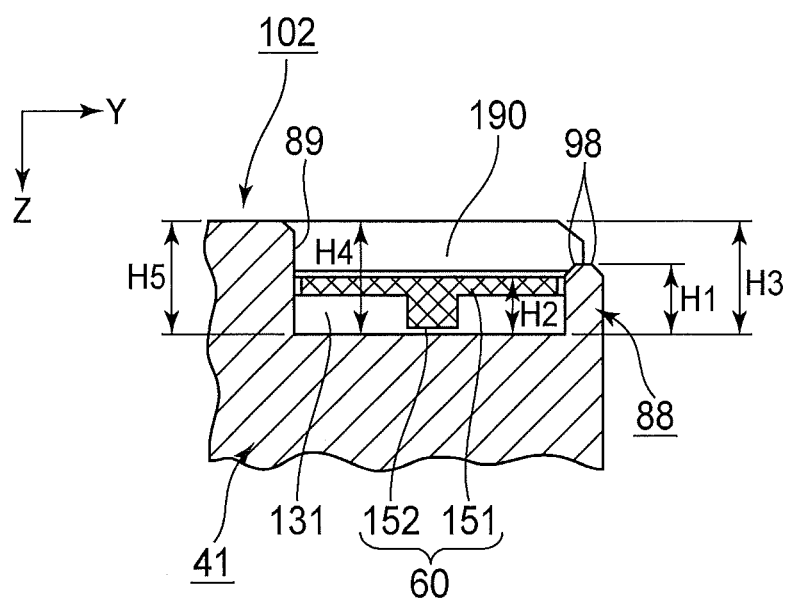
FIG. 20A is a cross-sectional view taken along a line A-A in FIG. 19.
Figure 21:
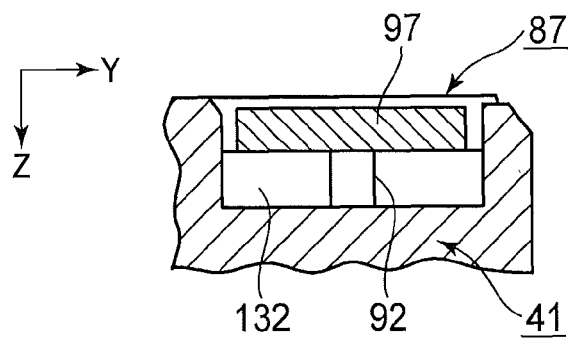
FIG. 21 is a cross-sectional view taken along a line B-B in FIG. 19.
Figure 22A:
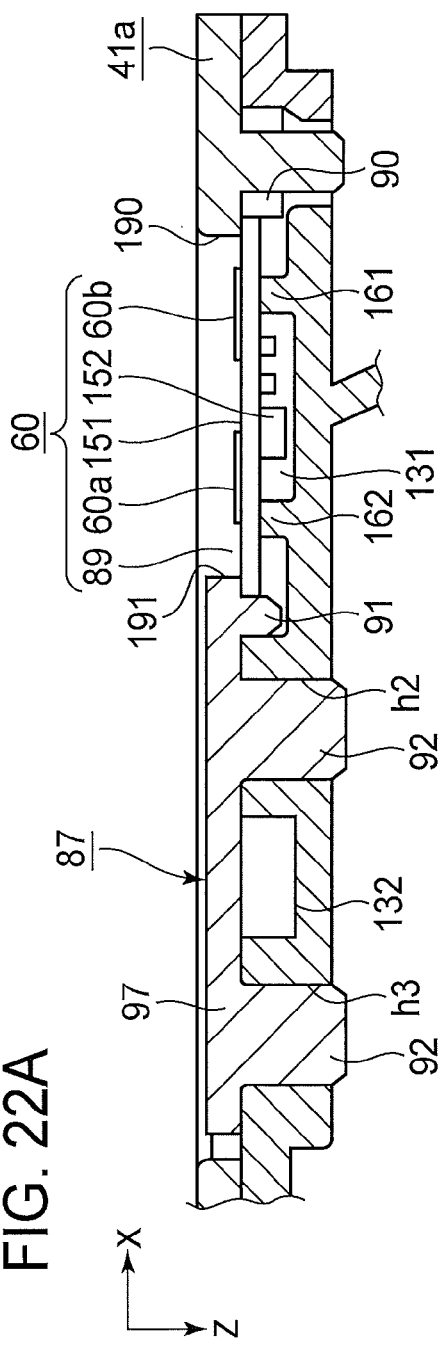
FIG. 22A is a cross-sectional view taken along a line C-C in FIG. 19.
Figure 22B:
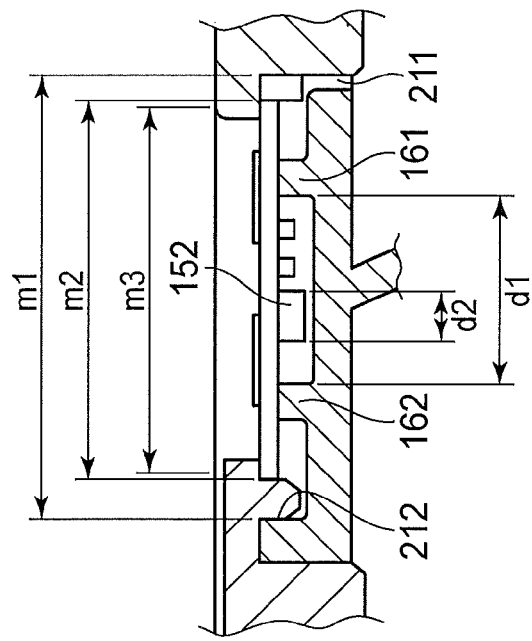
FIG. 22B is a portion of FIG. 22A.
Figure 22C:
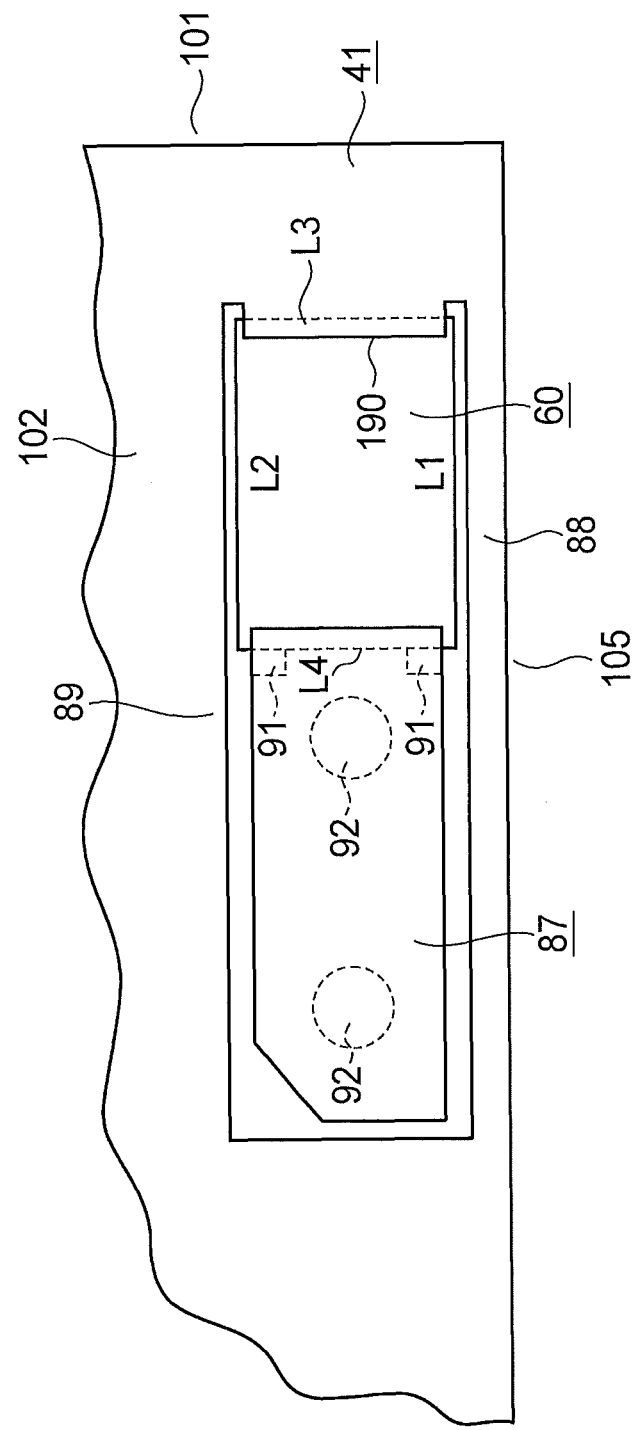
FIG. 22C is a fragmentary view of the toner cartridge, illustrating the positional relationship among the installation detecting board, the positioning elements, the retainer, and the recess.

FIG. 1 illustrates how the installation detecting board 60 is mounted on the toner cartridge 41. FIG. 17 is a first perspective view of a retainer 87 according to the first embodiment. FIG. 18 is a second perspective view of the retainer 87. FIG. 19 illustrates the pertinent portion of the toner cartridge 41. FIG. 20A is a cross-sectional view taken along a line A-A in FIG. 19. FIG. 21 is a cross-sectional view taken along a line B-B in FIG. 19. FIG. 22A is a cross-sectional view taken along a line C-C in FIG. 19. FIG. 22B is a portion of FIG. 22A. FIG. 22C is a fragmentary view of the toner cartridge 41, illustrating the positional relationship among the installation detecting board 60, the positioning elements 88 and 89, the retainer 87, and the recess 131.

Referring to FIG. 20A, the mounting surface R1 includes a rectangular recess 131 that is formed in the body 41a of the toner cartridge 41 and is located adjacent the front side wall 105 (not shown). The recess 131 receives the installation detecting board 60 therein.

The installation detecting board 60 includes a board 151 (FIG. 20c), the memory 152 mounted on the lower surface of the board 151, and first and second contacts 60a and 60b formed on the upper surface of the board 151. The board 151 has a first edge L1 that faces the front side wall 105, a second edge L2 opposite to the first edge L1, a third edge L3 that faces the side wall 101, and a fourth edge L4 opposite to the third edge L3. The installation detecting board 60 is detachably mounted in the recess 131.

A rectangular recess 132 is formed adjacent the recess 131, and receives the retainer 87 therein. The retainer 87 retains the installation detecting board 60 to the body 41a of the toner cartridge 41, and restrains movement of the installation detecting board 60 in the recess 131.

When the toner cartridge 41 has been completely inserted into the receiving space Sp, the mounting surface R1 is at the back end portion of the receiving space Sp, so that the first and second contacts 60a and 60b of the installation detecting board 60 are in electrical contact with the first and second contacts 66a and 66b on the toner cartridge supporting unit 61.

A first positioning element 88 and a second positioning element 89 rise from the bottom floor of the recess 131, and abut the edges L1 and L2 of the installation detecting board 60, respectively, so that the installation detecting board 60 is sandwiched between the first and second positioning elements 88 and 89. Also, a first positioning portion 90 and a second positioning portion 190 are formed in the recess 131.

The first positioning portion 90 is constituted of a pair of projections that project downward from the inner wall of the recess 131 and abuts the edge L3 of the installation detecting board 60. The second positioning portion 190 projects from the inner wall of the recess 131, and abuts from above the major surface of the installation detecting board 60 near the edge L3. Short ribs 161 and 162 rise from the bottom of the recess 131, and extend in the widthwise direction of the recess 131.

The first positioning element 88 and second positioning element 89 extend in the longitudinal direction (X-direction) of the recess 131. The height of the first positioning element 88 is smaller than the height of the second positioning element 89. The first positioning portion 90 is formed at each widthwise end of the recess 131. The second positioning portion 190 extends in the widthwise direction (Y-direction) of the recess 131.

The retainer 87 includes a rectangular flat plate 97 and a pair of posts 92 that are located at longitudinal end portions of the flat plate 97 and extend downward from the flat plate 97. The posts 92 are press-fitted into holes h2 and h3 formed in the recess 131 when the retainer 87 is mounted into the recess 131.

First positioning portion 91 includes a pair of projections which are formed on one longitudinal end portion of the flat plate 97, and extend downward from the flat plate 97. The first positioning portions 91 are aligned in the widthwise direction of the flat plate 97, and abut the edge L4 of the installation detecting board 60. A second positioning portion 191 is formed at one longitudinal end of the flat plate 97 near the first positioning portion 91. The second positioning portion 191 projects from the flat plate 97 in the longitudinal direction of the flat plate 97, and extends in the widthwise direction of the flat plate 97. When the retainer 87 has been mounted on the toner cartridge 41, the second positioning portion 191 abut from above the major surface of the installation detecting board 60 near the edge L4.

The longitudinal distance of the recess 131 or the distance between the walls 211 and 212 of the recess 131, the distance between the first positioning portions 90 and 91, and the distance between the longitudinal ends of the installation detecting board 60, i.e., between L3 and L4, are related as follows:

$$m1 > m2 > m3$$

where m1 is the distance between the walls 211 and 212, m2 is the distance between the first positioning portions 90 and 91, and m3 is the distance between the longitudinal ends of the installation detecting board 60.

In the first embodiment, the difference between the distances m1 and m2 is 2 mm, the difference between the distances m2 and m3 is 0.5 mm. The width of the memory 152 and the distance between ribs 161 and 162 that extend in the longitudinal direction of the recess 131 are related as follows:

$$d1 > d2$$

where d1 is the distance between the ribs 161 and 162, and d2 is the width of the memory 152.

The first and second positioning elements 88 and 89 abut the opposing edges L1 and L2 of the installation detecting board 60, respectively, thereby placing the installation detecting board 60 in position in the widthwise direction of the recess 131. The first positioning portion 90 and first positioning portion 91 abut another opposing edges L3 and L4 of the installation detecting board 60, respectively, thereby placing the installation detecting board 60 in position and prohibiting the installation detecting board 60 from moving in the longitudinal direction of the recess 131. The second positioning portions 190 and 191 abut the opposing edges of the installation detecting board 60, thereby preventing the installation detecting board 60 from moving in the direction of depth of the recess 131 (Z-direction). The ribs 161 and 162 abut the underside of the board 151 of the installation detecting board 60, thereby placing the installation detecting board 60 in position in the direction of depth of the recess 131.

Figure 20B:
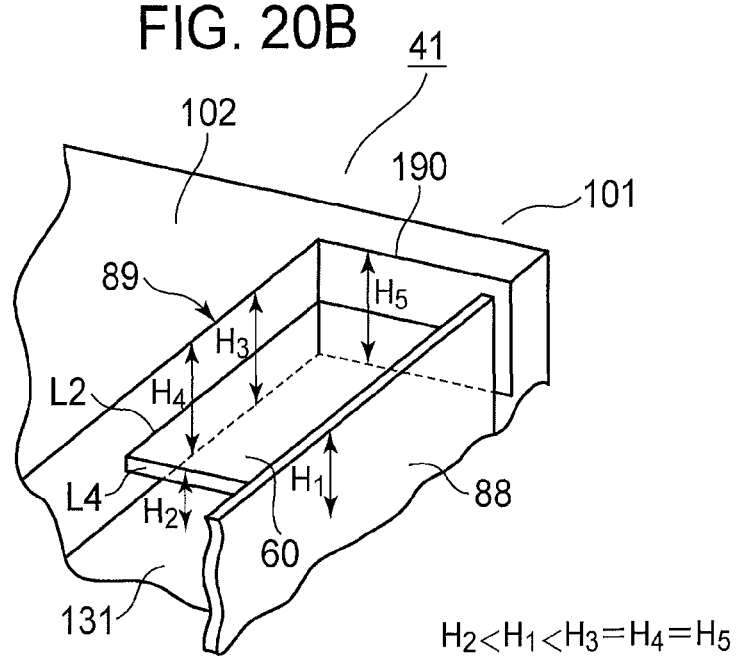
FIG. 20B is a perspective view illustrating the positional relationship among the installation detecting board, positioning elements, and a recess.

Referring to FIGS. 20A and 20B, if the distance H1 between the bottom of the recess 131 and the upper end of the first positioning element 88 is shorter than the distance H2 between the bottom of the recess 131 and the upper end of the installation detecting board 60, the contacts 66 on the toner cartridge supporting unit 61 will be scratched by the edges of the installation detecting board 60. Thus, the following relation is maintained.

$$H2 < H1$$

In addition, the upper end of the first positioning element 88 has chamfered surfaces 98 so that when the toner cartridge 41 is moved on the toner cartridge supporting unit 61, the contacts 66 will not interfere with the positioning element 88.

Figure 20C:
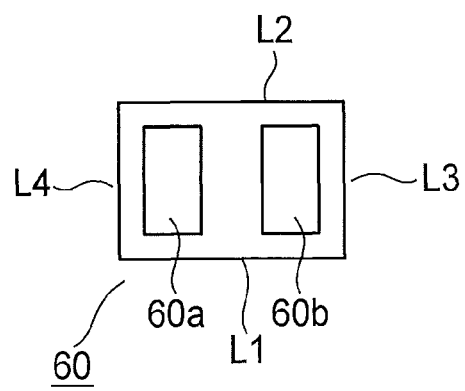
FIG. 20C illustrates the dimensions of the installation detecting board.

FIG. 20B is a perspective view illustrating the positional relationship among the installation detecting board 60, the positioning elements 88 and 89, and the recess 131. FIG. 20C illustrates the dimensions L1, L2, L3, and L4 of the installation detecting board 60. If the distance H1 is equal to the distance H3 between the bottom of the recess 131 and the outer surface of the bottom wall 102 of the toner cartridge 41, the contacts 66a and 66b on the toner cartridge 41 will slide on the positioning element 88 under a large friction load, which causes the contacts 66a and 66b to rapidly wear. Thus, the distances H1 and H3 are selected to satisfy the following relationship.

$$H1 < H3$$

In addition, if the distance H4 between the bottom of the recess 131 and the upper end of the positioning element 89 and the distance H5 between the bottom of the recess 131 and the upper end of the second positioning portion 190 are shorter than the distance H3, the installation detecting board 60 may not be reliably positioned and may not be properly limited in its movement. For this reason, the distances H3 to H5 are related as follows:

$$H3 = H4 = H5$$

Also, if the distance H3 is shorter than the distance H6 between the bottom of the recess 131 and the upper surface of the retainer 87, the toner cartridge 41 cannot be moved relative to the toner cartridge supporting unit 61. Thus, the relationship between the distances H3 and H6 is selected to satisfy the following relationship:

$$H6 \leq H3$$

therefore, the distances H1 to H6 are related as follows:

$$H2 < H1 < H3 < H6 \leq H3 = H4 = H5$$

A description will be given of how the installation detecting board 60 is mounted on the toner cartridge 41 according to the first embodiment will be described.

Figure 23:
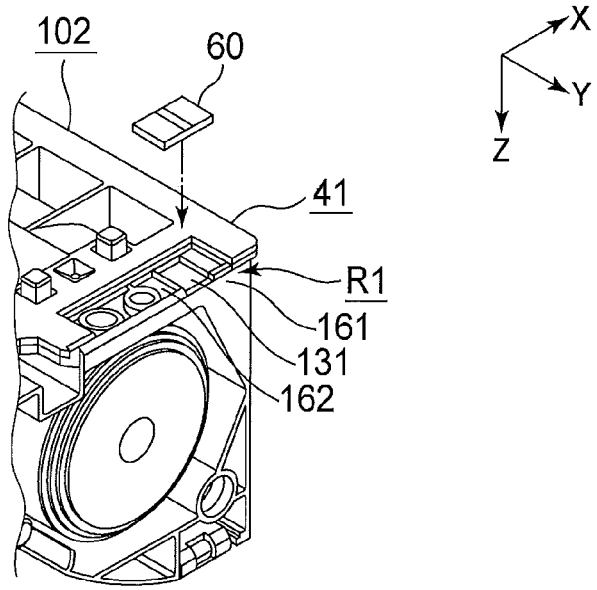
FIG. 23 is a first perspective view illustrating the method for mounting the installation detecting board.

FIG. 23 is a first perspective view illustrating the step for mounting the installation detecting board.

Figure 24:
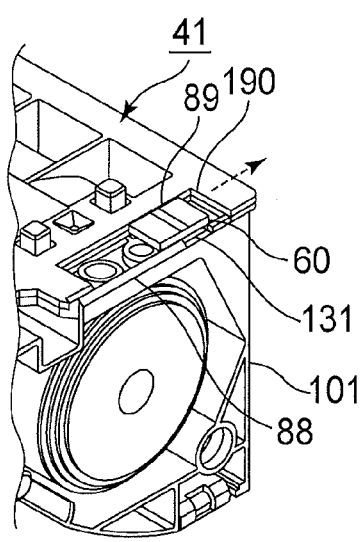
FIG. 24 is a second perspective view illustrating the method for mounting the installation detecting board.

FIG. 24 is a second perspective view illustrating the step for mounting the installation detecting board 60.

Figure 25:
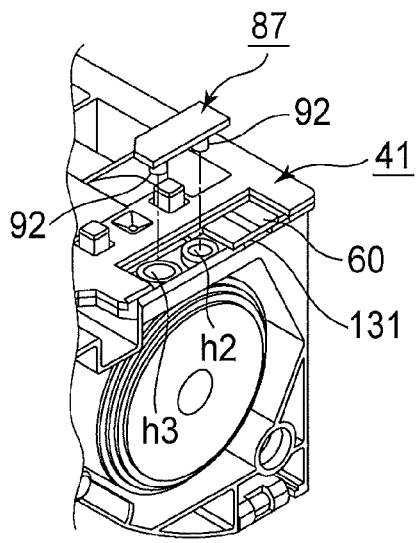
FIG. 25 is a third perspective view illustrating the method for mounting the installation detecting board.

FIG. 25 is a third perspective view illustrating the step for mounting the installation detecting board 60.

Figure 26:
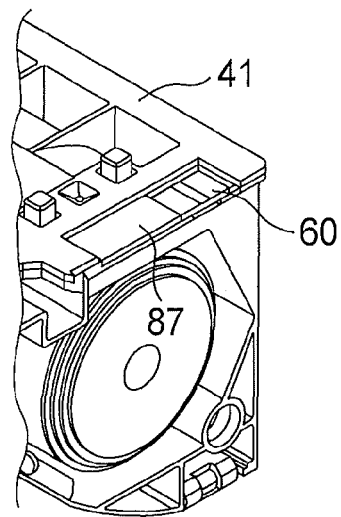
FIG. 26 is a fourth perspective view illustrating the method for mounting the installation detecting board.

FIG. 26 is a fourth perspective view illustrating the step for mounting the installation detecting board 60.

Referring to FIG. 23, the installation detecting board 60 is placed on the mounting surface R1 on the bottom wall 102 of the toner cartridge 41. Referring to FIG. 24, the installation detecting board 60 is inserted into the space 131 defined by the first and second positioning elements 88 and 89 and the first positioning portion 90 and second positioning portion 190. The installation detecting board 60 is then moved into contact engagement with the ribs 161 and 162.

The first and second positioning elements 88 and 89 limit the movement of the installation detecting board 60 in the widthwise direction (Y-direction) of the recess 131 but not in the longitudinal direction (X-direction) of the recess 131. Therefore, at this time, the installation detecting board 60 can be moved in the longitudinal direction so that the installation detecting board 60 can slide into the space.

Subsequently, the installation detecting board 60 is advanced toward the side wall 101 until the installation detecting board 60 abuts the first positioning portion 90. As a result, the edge L3 of the installation detecting board 60 gets under the second positioning portion 190.

Next, the posts 92 of the retainer 87 are pressed into the holes h2 and h3 as shown in FIGS. 25 and 26, respectively, thereby mounting the retainer 87 on the body 41a of the toner cartridge 41 so that the retainer 87 is positioned in the longitudinal direction and in the direction of depth (Z-direction) of the recess 132. The first positioning portion 91 and second positioning portion 191 of the retainer 87 limit the movement of the installation detecting board 60 both in the longitudinal direction and in the direction of height of the recess 131.

Next, a description will be given of the insertion limiter 85 and the insertion limiter 86 when the toner cartridge 41 is inserted into the receiving space Sp.

Figure 27:
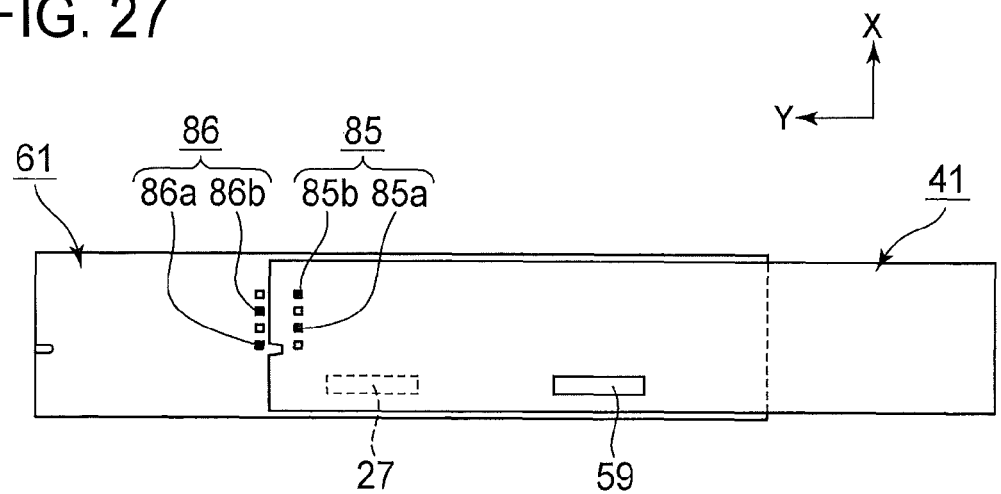
FIG. 27 is a first view illustrating insertion limiters.

FIG. 27 is a first view illustrating the insertion limiters 85 and 86.

Figure 28:
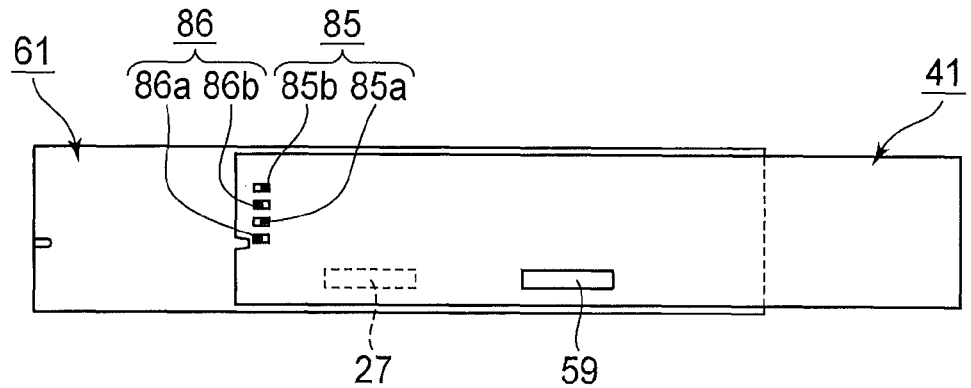
FIG. 28 is a second view illustrating the insertion limiters.

FIG. 28 is a second view illustrating the insertion limiters 85 and 86.

Figure 29:
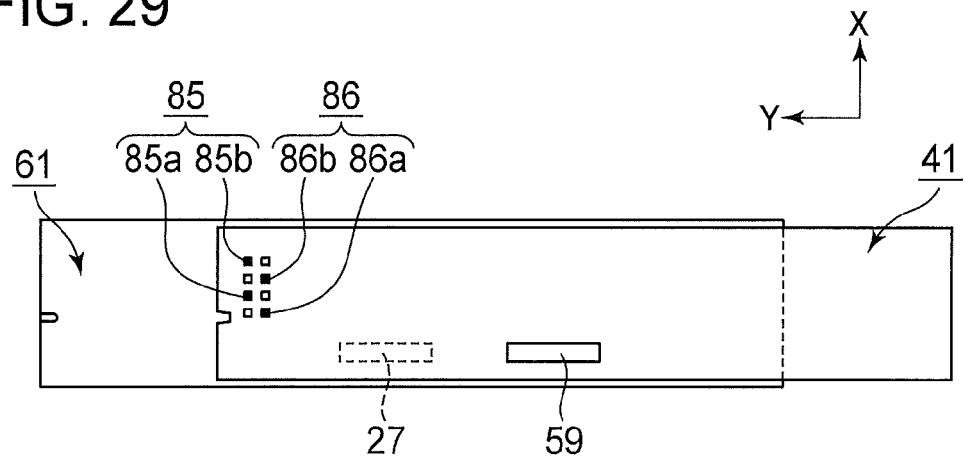
FIG. 29 is a third view illustrating the insertion limiters.

FIG. 29 is a third view illustrating the insertion limiters 85 and 86.

Figure 30:
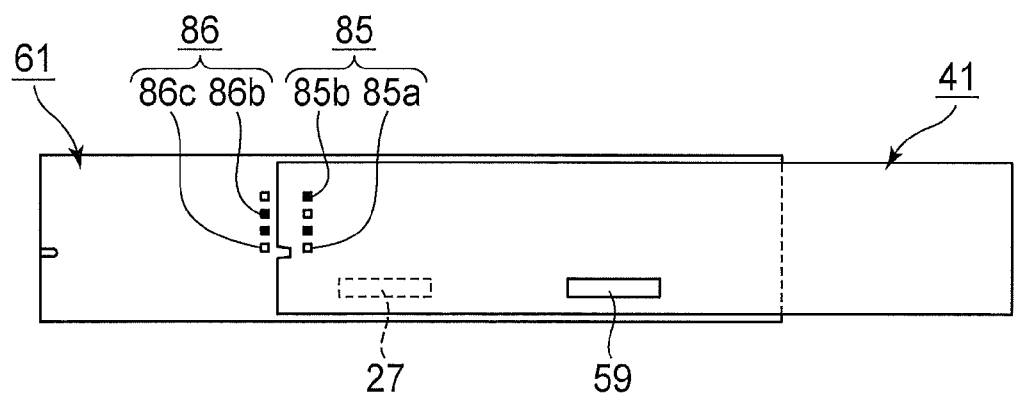
FIG. 30 is a fourth view illustrating the insertion limiters.

FIG. 30 is a fourth view illustrating the insertion limiters 85 and 86.

Figure 31:
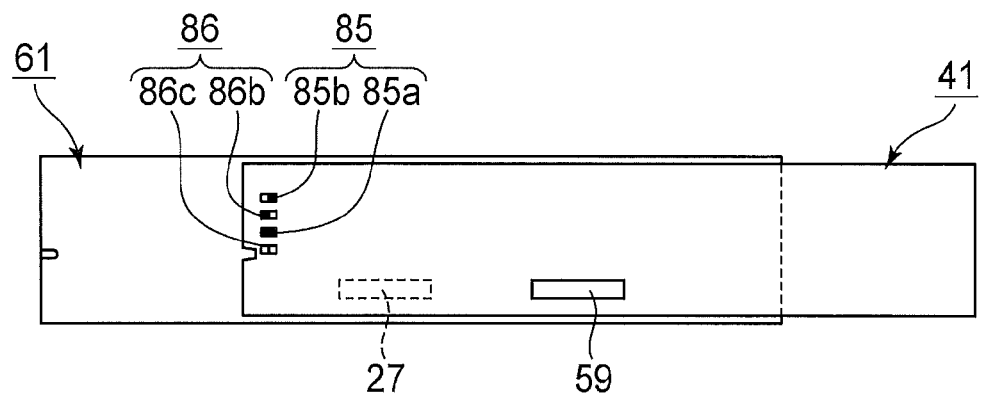
FIG. 31 is a fifth view illustrating the insertion limiters.

FIG. 31 is a fifth view illustrating the insertion limiters 85 and 86.

As shown in FIGS. 27-31, the toner cartridge 41 is supported on the toner cartridge supporting unit 61. The toner supplying path 27 is formed in the toner cartridge supporting unit 61. The toner cartridge 41 supplies the toner through the toner discharge opening 59. The toner cartridge 41 has the insertion limiter 85 and the toner cartridge supporting unit 61 has the insertion limiter 86.

First, a longitudinal end portion or first longitudinal end of the toner cartridge 41 is placed on the supporting surface 62 of the toner cartridge supporting unit 61. The toner cartridge 41 is then pushed into the receiving space Sp gradually.

Referring to FIGS. 27-29, if the toner cartridge 41 is the right cartridge to the body 37 (FIG. 3) of the image forming unit in terms of the color of toner, the limiting projections 86a and 86b of the insertion limiter 86 disposed on the toner cartridge supporting unit 61 do not interfere with the limiting projections 85a and 85b of the toner cartridge 41, allowing the toner cartridge 41 to smoothly advance into the receiving space Sp as shown in FIGS. 27-29.

The fact that toner cartridge 41 can enter the receiving space Sp without interference implies that the color of toner in the toner cartridge 41 is the same as that used in the body 37 of the image forming section.

Referring to FIGS. 30 and 31, if the toner cartridge 41 is not the right cartridge to the body 37 of the image forming unit in terms of the color of toner, the limiting projection 85a will interfere with the limiting projections 86c, so that the toner cartridge 41 cannot be inserted into the receiving space Sp.

The fact that the toner cartridge 41 cannot enter the receiving space Sp without interference implies that the color of toner in the toner cartridge 41 is not the same as that used in the body 37 of the image forming section.

In this manner, inadvertent insertion of the wrong toner cartridge 41 is prevented.

Next, a description will be given of how the toner cartridge 41 is inserted into and is pulled out of the receiving space Sp. The shutter 53 has the first engagement portion 107 and second engagement portion 108 formed at an end portion of the shutter 53 closer to the back side wall 104 of the toner cartridge 41.

The positional relationship between the first engagement portion 107 of the shutter 53 and the toner cartridge supporting unit 61 will be described with reference to FIGS. 32-35.

The positional relationship between the second engagement portion 108 of the shutter 53 and the toner cartridge supporting unit 61 will be described with reference to FIGS. 36-39.

Figure 32:
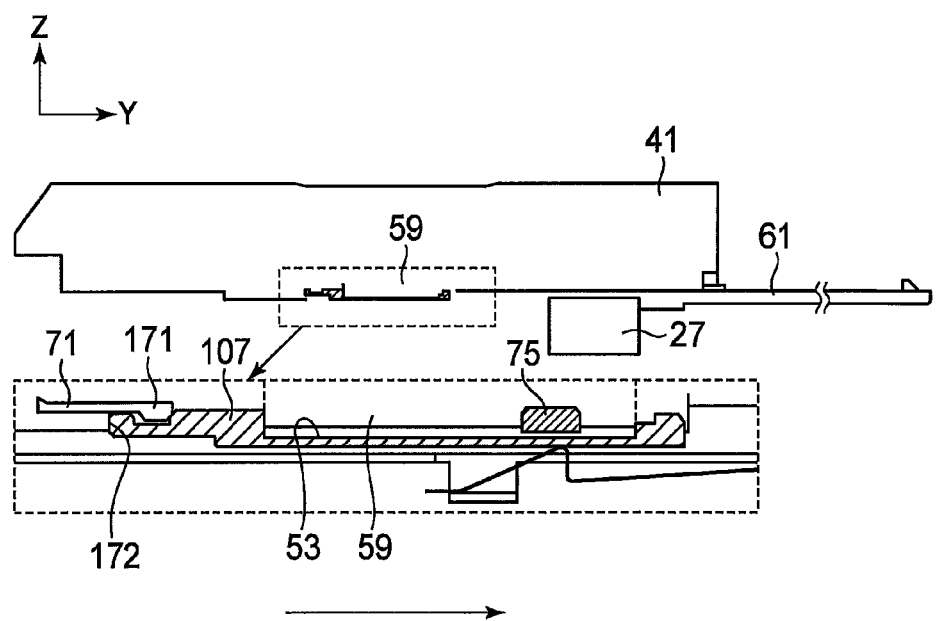
FIG. 32 is a first view of the first engagement portion of the toner cartridge and the toner cartridge supporting unit.

FIG. 32 is a first view of the first engagement portion 107 of the toner cartridge 41 and the toner cartridge supporting unit 61.

Figure 33:
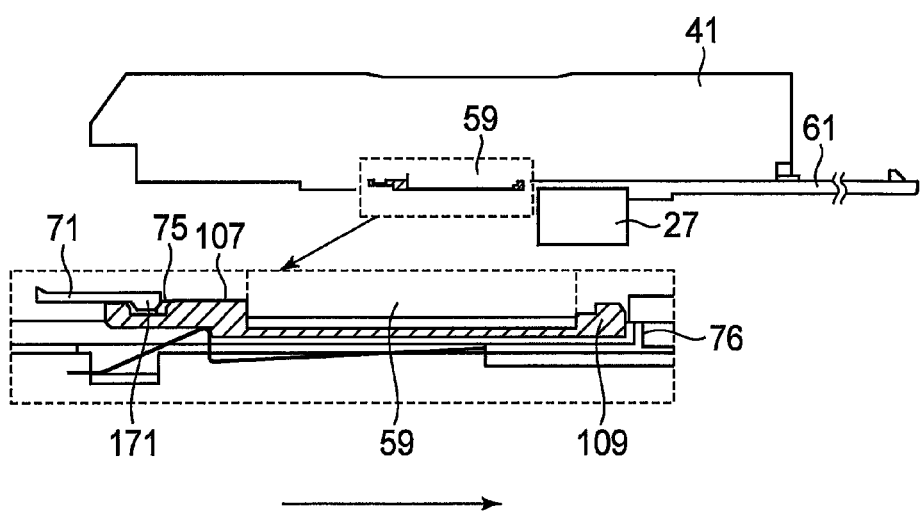
FIG. 33 is a second view of the first engagement portion of the toner cartridge and the toner cartridge supporting unit.

FIG. 33 is a second view of the first engagement portion 107 of the toner cartridge 41 and the toner cartridge supporting unit 61.

Figure 34:
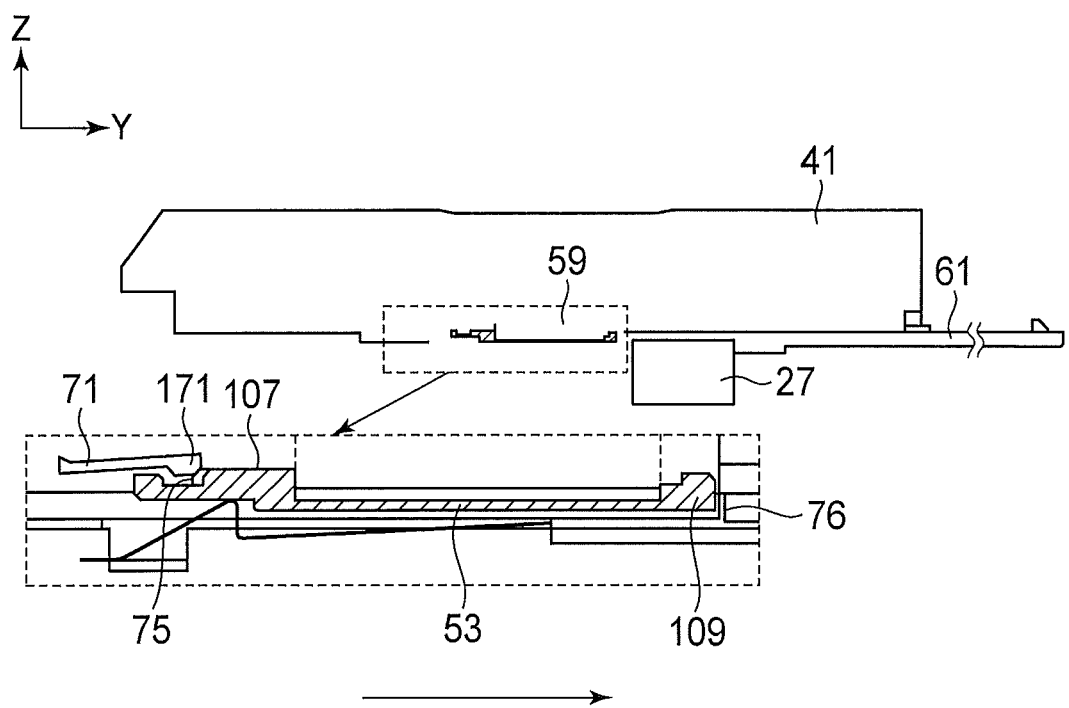
FIG. 34 is a third view of the first engagement portion of the toner cartridge and the toner cartridge supporting unit.

FIG. 34 is a third view of the first engagement portion 107 of the toner cartridge 41 and the toner cartridge supporting unit 61.

Figure 35:
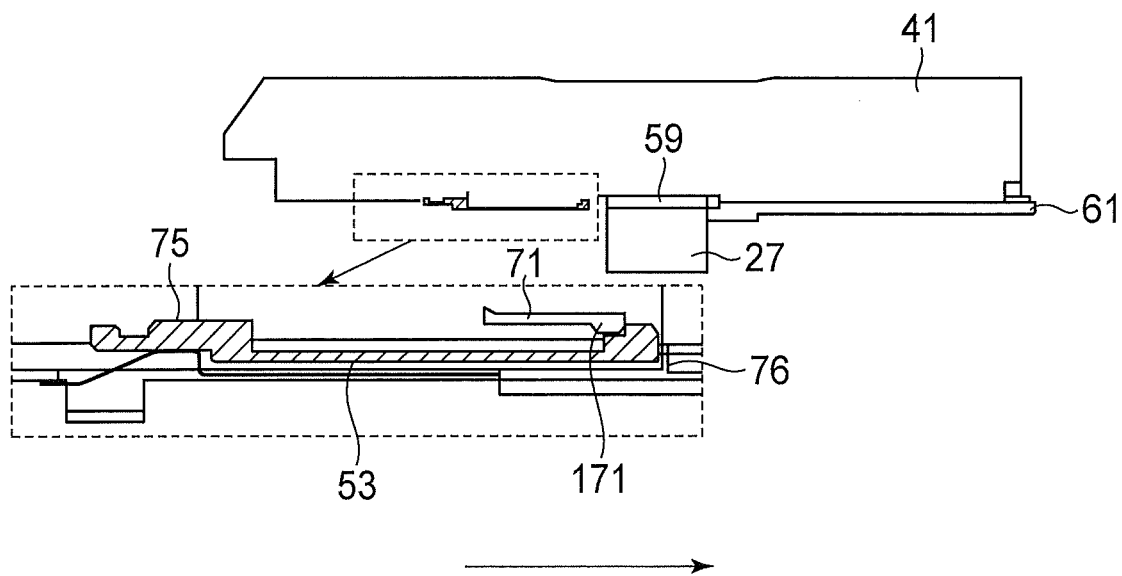
FIG. 35 is a fourth view of the first engagement portion of the toner cartridge and the toner cartridge supporting unit.

FIG. 35 is a fourth view of the first engagement portion 107 of the toner cartridge 41 and the toner cartridge supporting unit 61.

Figure 36:
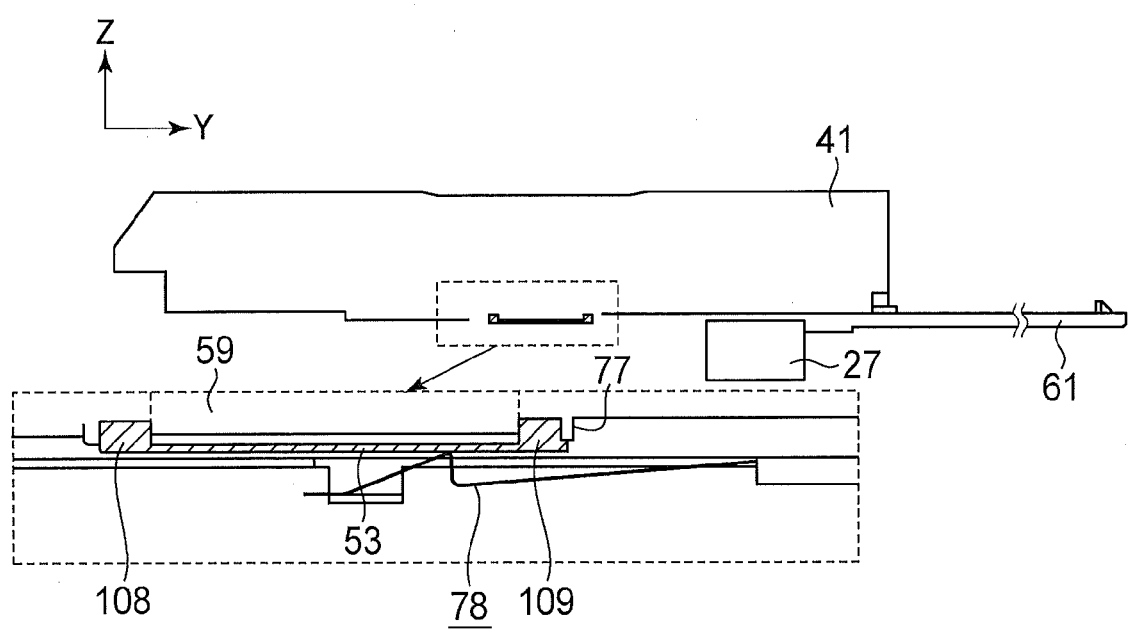
FIG. 36 is a first view of the second engagement portion of the toner cartridge and the toner cartridge supporting unit.

FIG. 36 is a first view of the second engagement portion 108 of the toner cartridge 41 and the toner cartridge supporting unit 61.

Figure 37:
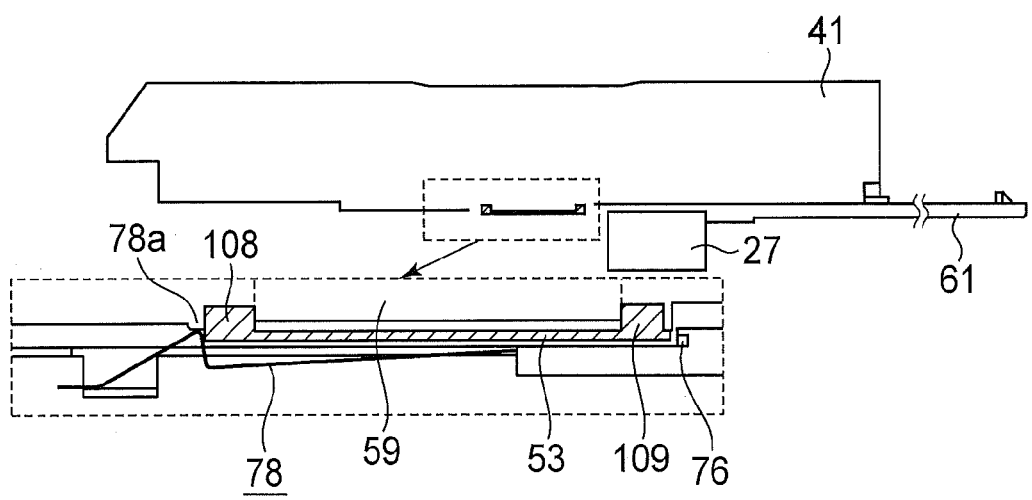
FIG. 37 is a second view of the second engagement portion of the toner cartridge and the toner cartridge supporting unit.

FIG. 37 is a second view of the second engagement portion 108 of the toner cartridge 41 and the toner cartridge supporting unit 61.

Figure 38:
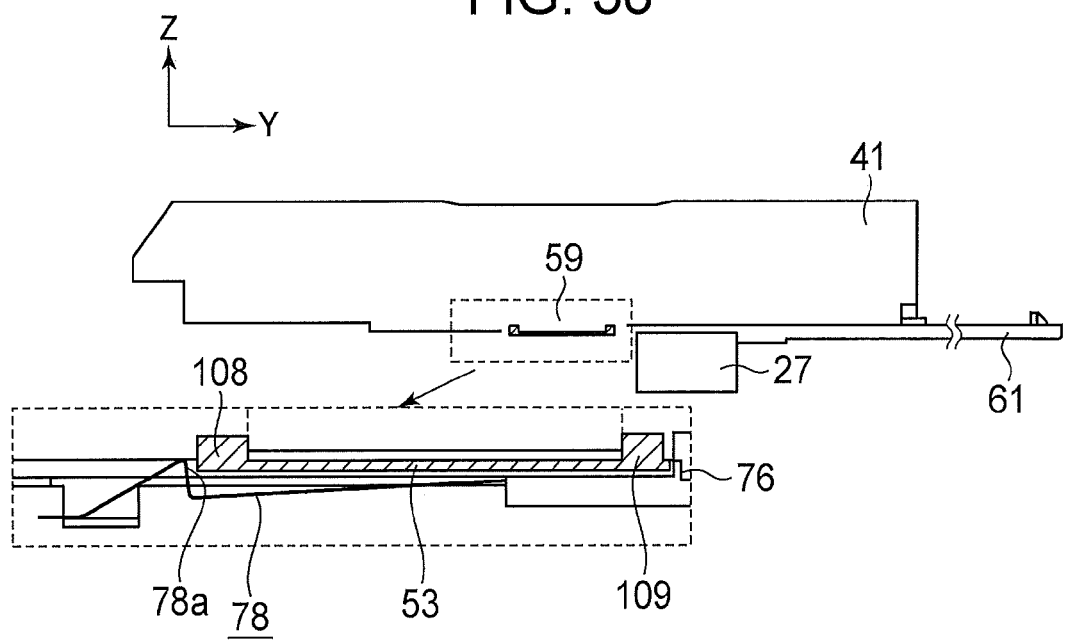
FIG. 38 is a third view of the second engagement portion of the toner cartridge and the toner cartridge supporting unit.

FIG. 38 is a third view of the second engagement portion 108 of the toner cartridge 41 and the toner cartridge supporting unit 61.

Figure 39:
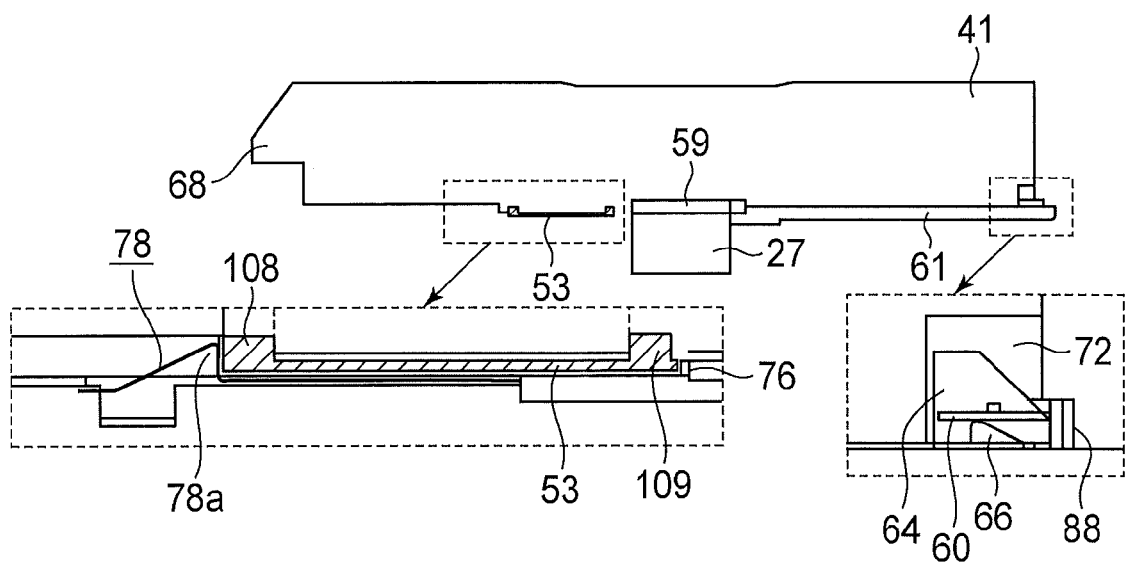
FIG. 39 is a fourth view of the second engagement portion of the toner cartridge and the toner cartridge supporting unit.

FIG. 39 is a fourth view of the second engagement portion 108 of the toner cartridge 41 and the toner cartridge supporting unit 61.

As shown in FIGS. 32-39, the toner cartridge 41 has a shutter 53 attached thereto, and is supported on the toner cartridge supporting unit 61. The toner supplying path 27 is formed in the toner cartridge supporting unit 61. The toner cartridge 41 supplies the toner through the toner guiding port 115 formed in the toner cartridge 41. The first latch 71 is mounted to the bottom wall 102 of the toner cartridge 41. The latch releasing post 75 (FIG. 8) is formed on the toner cartridge supporting unit 61. A stopper 77 is formed on the bottom wall 102 of the toner cartridge 41, and stops the shutter 53 at a position where the shutter 53 closes the toner discharge opening 59. The second latch 78 is disposed on the toner cartridge supporting unit 61.

First, the front cover 29 (FIG. 4) is opened and the toner cartridge 41 is placed on the supporting surface 62 of the toner cartridge supporting unit 61. The toner cartridge 41 is then gradually inserted into the receiving space Sp in a direction of an arrow. As shown in FIG. 32, a distal end portion 171 of the first latch 71 is received in a recess 172 formed in the first engagement portion 107 of the shutter 53, so that as the toner cartridge 41 advances into the receiving space Sp, the shutter 53 also advances into the receiving space Sp. As shown in FIGS. 32 and 36, when the stopper 77 abuts an abutment 109 formed on the shutter 53 closer to the front side wall 105, the shutter 53 presses the second latch 78 so that the second latch 78 resiliently flexes downward.

Once the insertion limiter 85 clears the insertion limiter 86, the first latch 71 starts to be pushed up by the latch releasing post 75 to resiliently flex upward as shown in FIG. 33, so that the distal end portion 171 starts to move out of the recess 172.

Once the distal end portion 171 has moved out of the recess 172 as shown in FIG. 34, the shutter 53 is allowed to move relative to the bottom wall 102 of the toner cartridge 41, so that the shutter 53 can now open and close the toner discharge opening 59. Also, the abutment 109 abuts the shutter movement limiting element 76 formed on the toner cartridge supporting unit 61, at which time, a top end 78a of the second latch 78 moves off the underside of the shutter 53, causing the second latch 78 to flex upward to regain its original shape.

Figure 40:
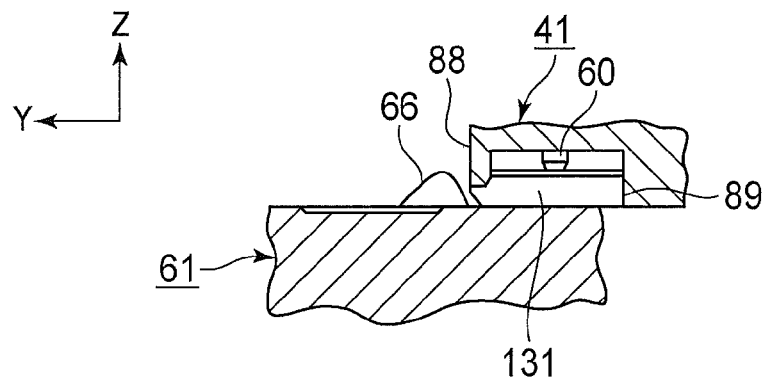
FIG. 40 is a first view illustrating the contact when the front end of the toner cartridge arrives at the back end of the toner cartridge supporting unit.

As the toner cartridge 41 further advances as shown in FIG. 35, the shutter 53 is stopped by the shutter movement limiting element 76 and opens the toner discharge opening 59 since the abutment 109 is abutting the shutter movement limiting element 76. When the toner discharge opening 59 becomes in alignment with the toner supplying path 27, the toner cartridge 41 is stopped. At this time, the front end of the toner cartridge 41 has arrived at the back end of the toner cartridge supporting unit 61, and the top end 78a moves into engagement with the second engagement portion 108 as shown in FIG. 39, so that the positioning projection 64 is received in the groove 72. Referring to FIG. 40, the first positioning element 88 formed on the mounting surface R1 climbs over the first and second contacts 66a and 66b so that the installation detecting board 60 moves into contact with the first and second contacts 66a and 66b. In this manner, the toner cartridge 41 can be inserted into the receiving space Sp.

Once the front cover 29 is closed, the controller makes a decision to determine whether communication between the controller and the installation detecting board 60 may be possible. If communication is possible, the controller determines that the toner cartridge 41 has been inserted properly into the receiving space Sp, and then the printer 10 becomes ready for printing. If communication is not possible, the controller determines that the toner cartridge 41 has not been properly inserted, and the printer 10 is not ready to print. The controller then causes a display unit (not shown), e.g., a liquid crystal display (LCD) to display to the user a message indicative that the toner cartridge 41 has not been inserted properly.

Next, a description will be given of the contact 66 when the front end of the toner cartridge 41 arrives at the back end of the toner cartridge supporting unit 61.

FIG. 40 is a first view illustrating the contact 66 when the front end of the toner cartridge 41 arrives at the back end of the toner cartridge supporting unit 61.

Figure 41:
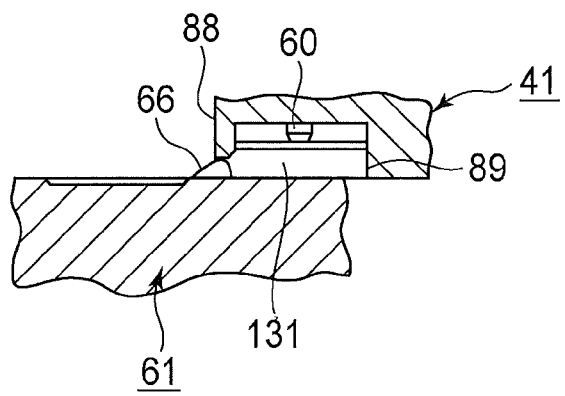
FIG. 41 is a second view illustrating a contact when the front end of the toner cartridge starts to climb over the contact.

FIG. 41 is a second view illustrating the contact 66 when the front end of the toner cartridge 41 starts to climb over the contact 66.

Figure 42:
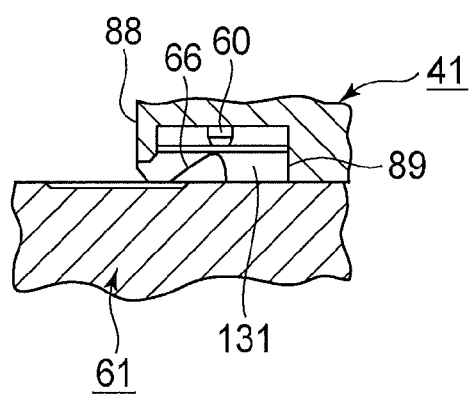
FIG. 42 is a third view illustrating the contact when the front end of the toner cartridge has climbed over the contacts.

FIG. 42 is a third view illustrating the contact 66 when the front end of the toner cartridge 41 has passed over the contacts 66.

Figure 43:
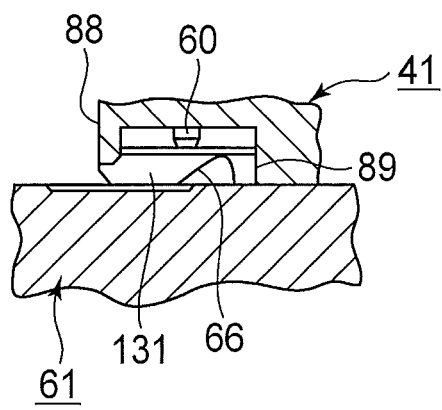
FIG. 43 is a fourth view illustrating the contact when the front end of the toner cartridge further advances to the back end of the toner cartridge supporting unit.

FIG. 43 is a fourth view illustrating the contact 66 when the front end of the toner cartridge 41 further advances toward the back end of the toner cartridge supporting unit 61.

Figure 44:
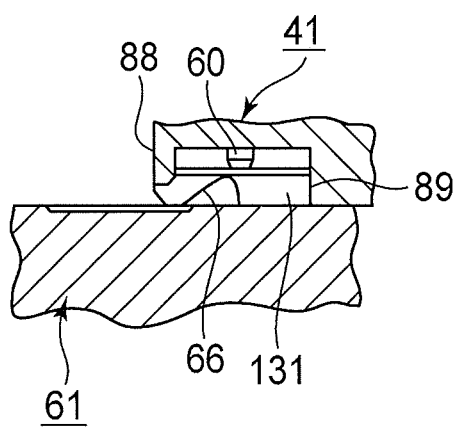
FIG. 44 is a fifth view illustrating the contact when the front end of the toner cartridge has completely arrived at the back end of the toner cartridge supporting unit.

FIG. 44 is a fifth view illustrating the contact 66 when the front end of the toner cartridge 41 has completely arrived at the back end of the toner cartridge supporting unit 61, a slightly different position from FIG. 43.

When the front end of the toner cartridge 41 has arrived at the back end of the toner cartridge supporting unit 61, the contact 66 deforms to pass the gap between the first positioning element 88 and the toner cartridge supporting unit 61, and then enters the recess 131 to resiliently contact the installation detecting board 60.

When the front end of the toner cartridge 41 reaches the back end of the receiving space Sp, the surface S2 of the gear 54a may interfere with the surface S1 of the drive 57 as shown in FIG. 16B, so that the driver gear 57 cannot move into a meshing engagement with the gears 54a and 54b. Thus, the drive gear 57 and intermediate gear 123 are pushed back against the urging force of the spring 58, in which case the front end of the toner cartridge 41 is about 0.5 to 1 mm away from its final position where the toner cartridge 41 should be. Since the installation detecting board 60 is mounted on the bottom wall 102 of the toner cartridge 41 as shown in FIGS. 43 and 44, the contact 66 can still be in contact with the first and second contacts 60a and 60b of the installation detecting board 60 despite the fact that the installation detecting board 66 is slightly off the final position where the toner cartridge 41 should be. In addition, the contact 66 can be in contact with the installation detecting board 60 under predetermined contact pressure. The first and second contacts 60a and 60b of the installation detecting board 60 remain in sure contact with the contact 66 due to the weight of the toner cartridge 41.

As described above, the distance H1 (FIG. 20A) is shorter than the distance H5, so that the first positioning element 88 exerts only a small pressure on the contact 66 when the contact 66 passes through the gap between the first positioning element 88 and the toner cartridge supporting unit 61. Thus, the contact 66 can resiliently deform when it passes through the gap.

The installation detecting board 60 is disposed adjacent the front side wall 105 so that the installation detecting board 60 moves into contact with the contact 66 only when the front end of the toner cartridge 41 has arrived near or at the back end of the toner cartridge supporting unit 61. This reduces the chance of the contact 66 contacting or scratching the outer surface of the bottom wall 102 of the toner cartridge 41, preventing rapid wear-out of the surface of the gold-plated contact 66.

Next, a description will be given of how the toner cartridge 41 is pulled out of the receiving space Sp.

As the toner cartridge 41 advances into the receiving space Sp, the abutment 109 of the shutter 53 abuts the shutter movement limiting element 76, so that the shutter movement limiting element 76 causes the shutter 53 to open the toner discharge opening 59 as shown in FIG. 35. When the top end 78a of the second latch 78 engages the second engagement portion 108 of the shutter 53 and the installation detecting board 60 is in contact with the contact 66, the user holds the handhold 68 of the toner cartridge 41 and then pulls it toward him, so that the stopper 77 abuts the abutment 109 causing the shutter 53 to completely close the toner discharge opening 90.

As the toner cartridge 41 is further pulled, the second latch 78 yieldably deforms due to the force to pull the toner cartridge 41 so that the top end 78a moves out of engagement with the second engagement portion 108. In this manner, the toner cartridge 41 can be pulled out of the receiving space Sp.

As the toner cartridge 41 is pulled out of the receiving space Sp, the first latch 71 moves together with the toner cartridge 41 and engages the latch releasing post 75. As the toner cartridge 41 is further pulled, the latch releasing post 75 enters under the distal end portion 171 of the first latch 71 so that the distal end portion 171 is pushed upward and climbs over the latch releasing post 75 and the distal end portion 171 drops into the recess 172 formed in the first engagement portion 107 of the shutter 53.

In the first embodiment, the first edge L1 (FIG. 1) and second edge L2 of the installation detecting board 60 abut the first positioning element 88 and the second positioning element 89, respectively. Thus, the installation detecting board 60 can be positioned in the widthwise direction (Y-direction) of the recess 131. The edge L4 of the installation detecting board 60 abuts the first positioning portion 91 and the second positioning portion 191 and the retainer 87 is then mounted on the body 41a of the toner cartridge 41, thereby limiting movement of the installation detecting board 60 in its longitudinal direction (X-direction) and its widthwise direction (Y-direction).

Therefore, the first embodiment simplifies the operation for mounting the installation detecting board 60 on the toner cartridge 41, so that the installation detecting board 60 can be mounted easily and reliably on the body 41a of the toner cartridge 41.

The ribs 161 and 162 are formed on the bottom of the recess 131 to extend in a direction parallel to the direction in which the toner cartridge 41 is inserted into and pulled out of the receiving space Sp. This protects the installation detecting board 60 from any external forces that could be exerted when the toner cartridge 41 is inserted into and pulled out of the receiving space Sp. Therefore, this configuration makes the installation detecting board 60 durable.

Mounting the retainer 87 on the body 41a of the toner cartridge 41 places the retainer 87 in position in the longitudinal direction of and in the direction of depth of the recess 132. This configuration adequately protects the installation detecting board 60 from inadvertent external forces when the toner cartridge 41 is being inserted into or pulled out of the receiving space Sp. The posts 92 of the retainer 87 are press-fitted into the holes h2 and h3, thereby reliably mounting the retainer 87 to the body 41a of the toner cartridge 41. When the toner cartridge 41 is inserted into or pulled out of the receiving space Sp, even if external forces are exerted on the retainer 87, such external forces act in the widthwise direction of the retainer 87 and not in the direction of height. Therefore, the posts 92 will not be easily pulled out of the holes h2 and h3, and hence the retainer 87 will not come off the toner cartridge 41.

The installation detecting board 60 is mounted substantially in the direction in which the posts 92 of the retainer 87 are press-fitted into the holes h2 and h3. This simplifies the operation for mounting the installation detecting board 60 and the retainer 87 to the body 41a of the toner cartridge 41.

Second Embodiment

Elements similar to those of the first embodiment have been given like reference characters, and their detailed description is omitted. The same structures as those in the first embodiment provide the same effects as those in the first embodiment.

Figure 45:
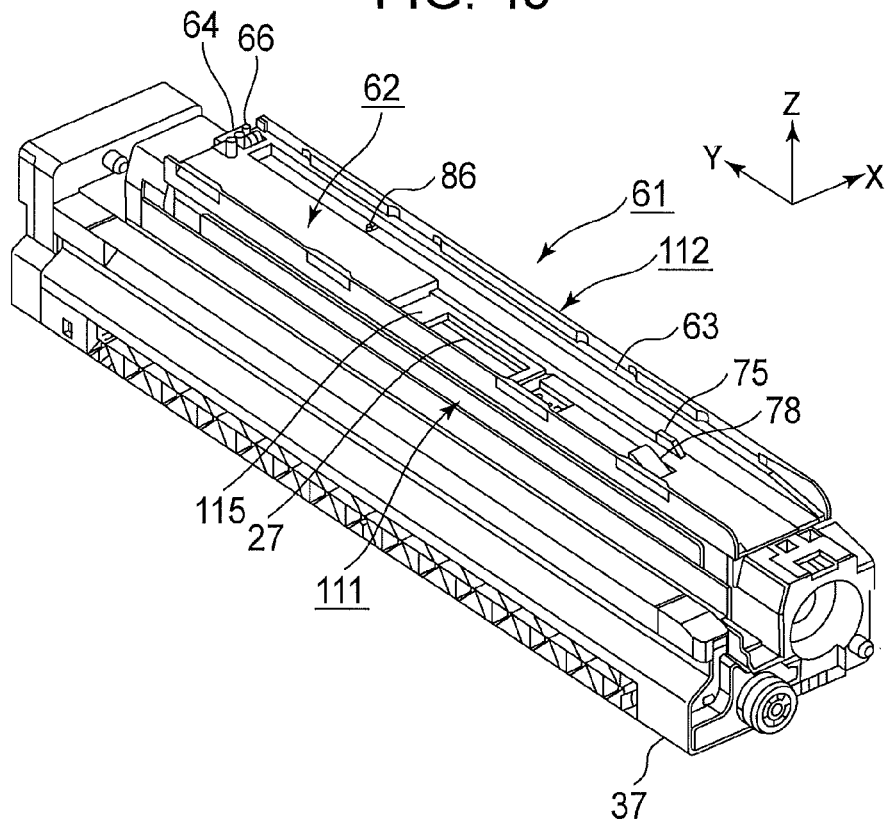
FIG. 45 illustrates the toner cartridge supporting unit according to the second embodiment.

FIG. 45 illustrates the toner cartridge supporting unit 61 according to the second embodiment.

It is to be noted that a toner cartridge supporting unit 61 is directly mounted on the body 37 of the image forming unit, eliminating the need for the toner supplying path 27 (FIG. 3). The toner is discharged from the toner cartridge 41 and is supplied into the image forming unit through a toner guiding port 115.

Third Embodiment

Elements similar to those of the first and second embodiments have been given similar reference characters and their detailed description is omitted. The same structures as those in the first embodiment provide the same effects as those in the first embodiment.

Figure 46:
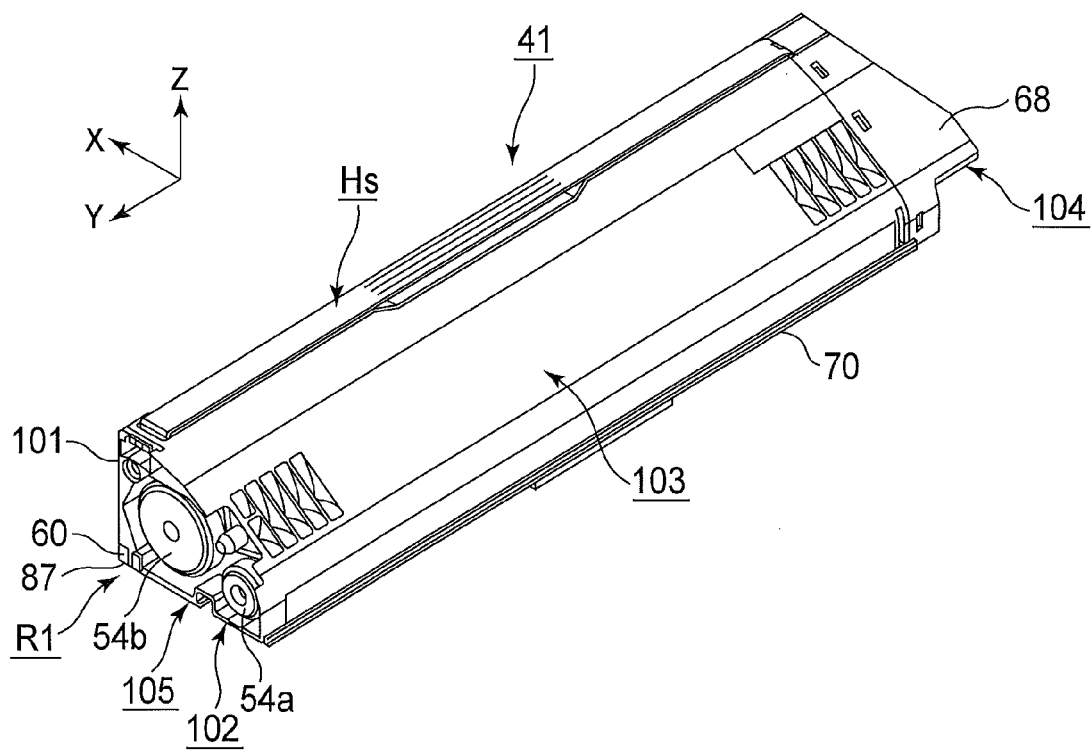
FIG. 46 is a perspective view of a toner cartridge according to a third embodiment.

FIG. 46 is a perspective view of a toner cartridge 41 according to a third embodiment.

Figure 47:
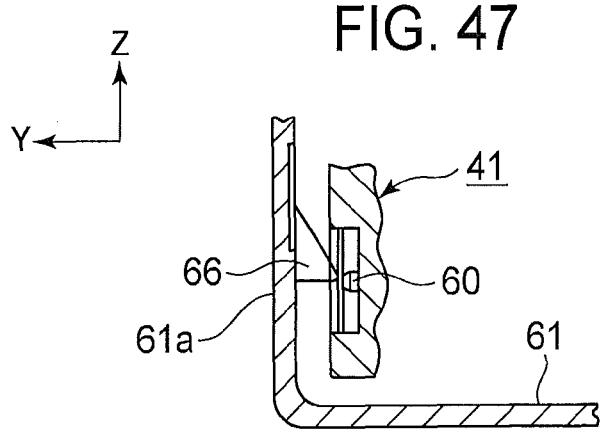
FIG. 47 is a first view illustrating contacts when the toner cartridge is near the back end of a toner cartridge supporting unit according to the third embodiment.

FIG. 47 is a first view illustrating a contact 66 when the front end of the toner cartridge 41 is near the back end of a toner cartridge supporting unit 61.

Figure 48:
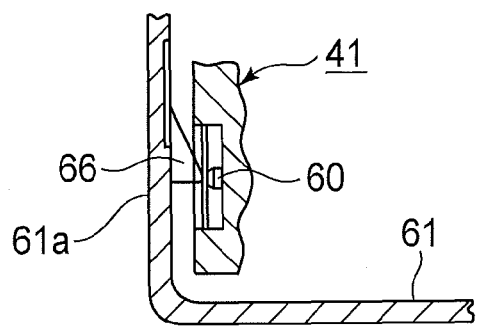
FIG. 48 is a second view illustrating the contacts deformed when the toner cartridge is further advanced toward the back end of the toner cartridge supporting unit.

FIG. 48 is a second view illustrating the contact 66 deformed when the toner cartridge 41 is further advanced toward the back end of the toner cartridge supporting unit 61.

Figure 49:
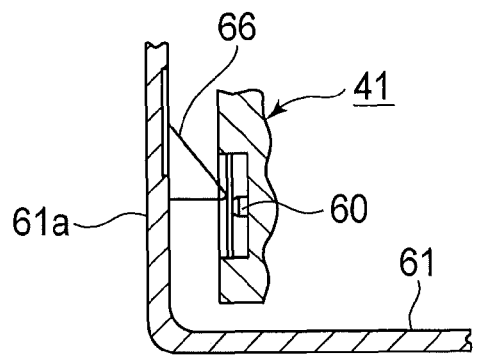
FIG. 49 is a third view illustrating the contacts when the toner cartridge has completely arrived at the back end of the toner cartridge supporting unit.

FIG. 49 is a third view illustrating the contact 66 when the toner cartridge 41 has completely arrived at the back end of the toner cartridge supporting unit 61.

As shown in FIG. 46, the toner cartridge 41 is supported on the toner cartridge supporting unit 61. A side wall 101 or a first wall extends in the Z-direction and longitudinally in the Y-direction, and a bottom wall 102 or a second wall also extends in the Y-direction. The toner cartridge 41 also includes a back side wall 104 or a fourth wall located at one longitudinal end of the toner cartridge 41 and a front side wall 105 or a fifth wall located at another longitudinal end of the toner cartridge 41. An inclined side wall 103 or a second wall extends across the side wall 101 and the bottom wall 102, and meets the front side wall 105 and the back side wall 104.

A mounting surface R1 is formed on the front side wall 105 of the toner cartridge 41 in the vicinity of the side wall 101. A retainer 87 as a movement limiting member and an installation detecting board 60 are disposed on the mounting surface R1.

As shown in FIGS. 47-49, the toner cartridge supporting unit 61 has an abutment 61a, which is formed by cutting and raising a part of an end portion of the supporting surface 62 of the toner cartridge supporting unit 61.

When the toner cartridge 41 is inserted into the receiving space Sp (FIG. 14), the surface S1 of a drive gear 57 may abut the surface S2 of a gear 54a and cannot smoothly move into a meshing engagement with the gear 54a. At this time, the spring 58 causes the toner cartridge 41 to be about 0.5-1 mm away from a position where the toner cartridge 41 would be if the gears 57 and 54a were in complete engagement with each other. The installation detecting board 60 is mounted on the front side wall 105, and so the position of the installation detecting board 60 is mounted at a different position from the first embodiment as shown in FIGS. 47-49.

In the third embodiment, the dimensions of the contacts 66a and 66b are selected such that the contacts 66a and 66b can reliably contact the installation detecting board 60.

Fourth Embodiment

Elements similar to those of the first and second embodiments have been given similar reference characters and their detailed description is omitted. The same structures as those in the first embodiment provide the same effects as those in the first embodiment.

Figure 50:
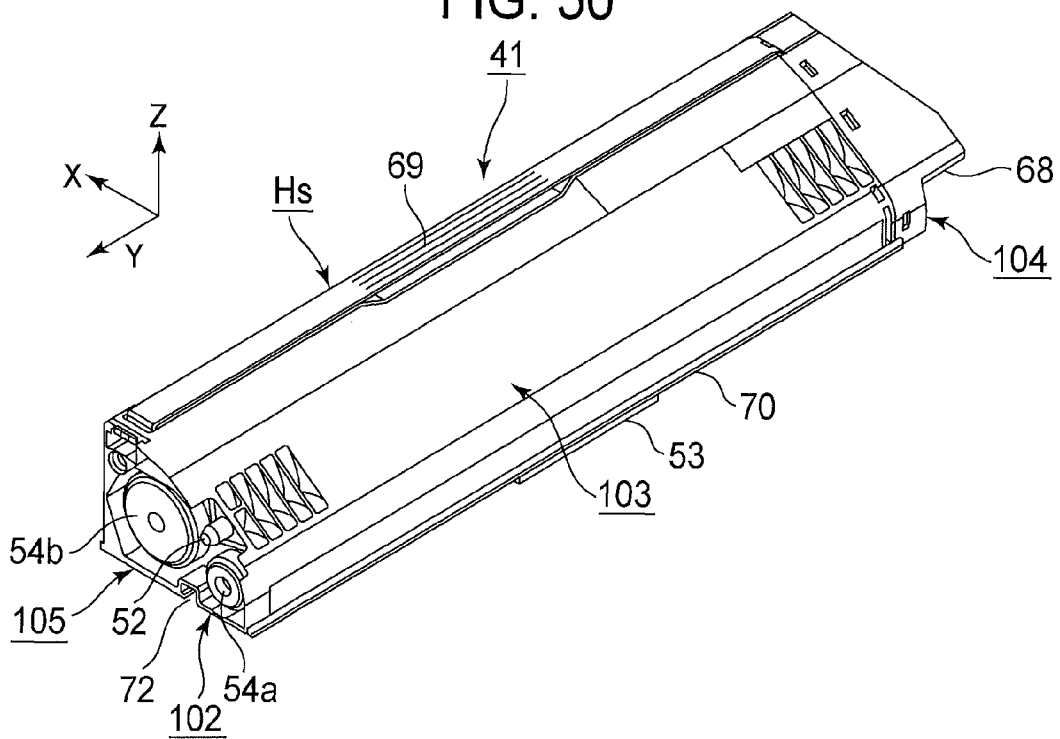
FIG. 50 is a first perspective view of a toner cartridge according to a fourth embodiment.

FIG. 50 is a first perspective view of a toner cartridge 41 according to a fourth embodiment.

Figure 51:
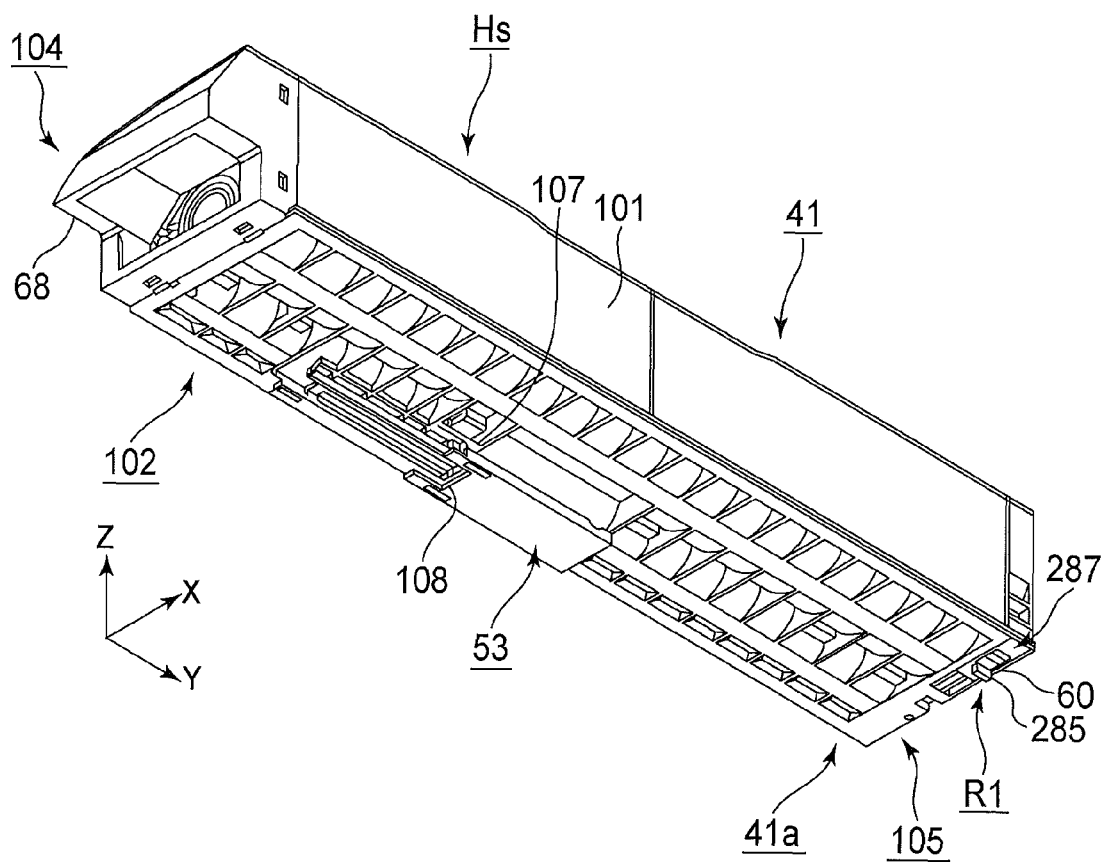
FIG. 51 is a second perspective view of the toner cartridge according to the fourth embodiment.

FIG. 51 is a second perspective view of the toner cartridge according to the fourth embodiment.

Figure 52:
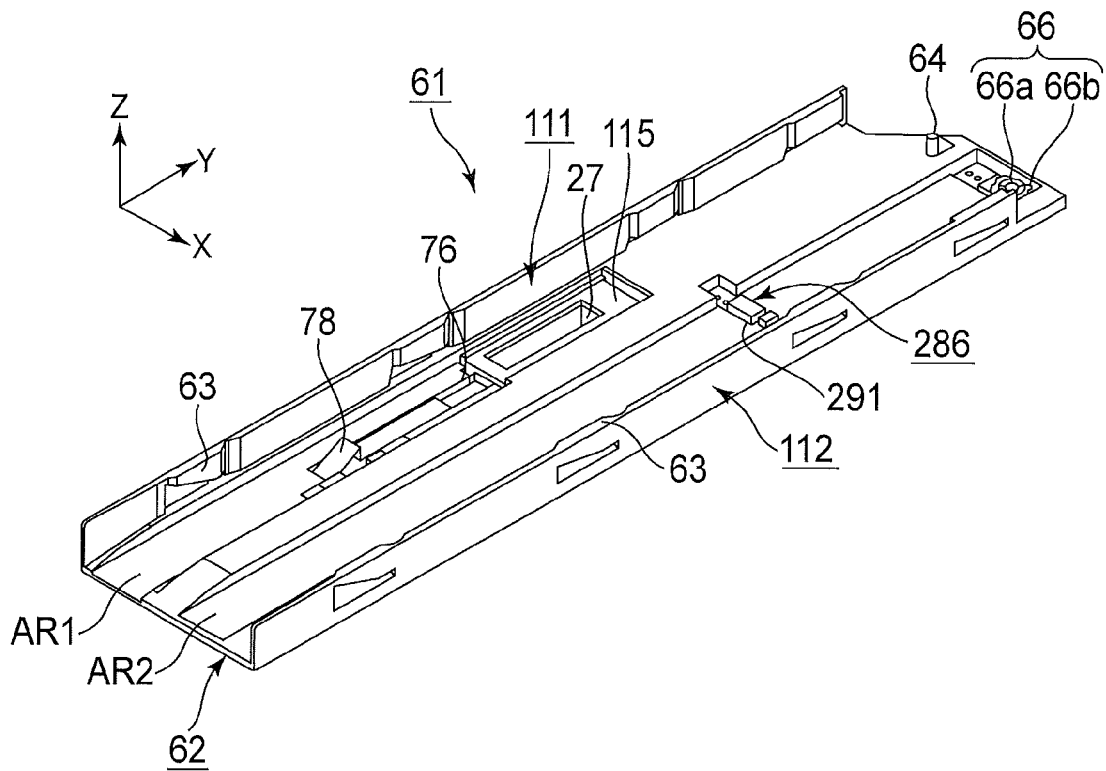
FIG. 52 is a first perspective view of a toner cartridge supporting unit according to the fourth embodiment.

FIG. 52 is a first perspective view of a toner cartridge supporting unit 61 according to the fourth embodiment.

Figure 53:
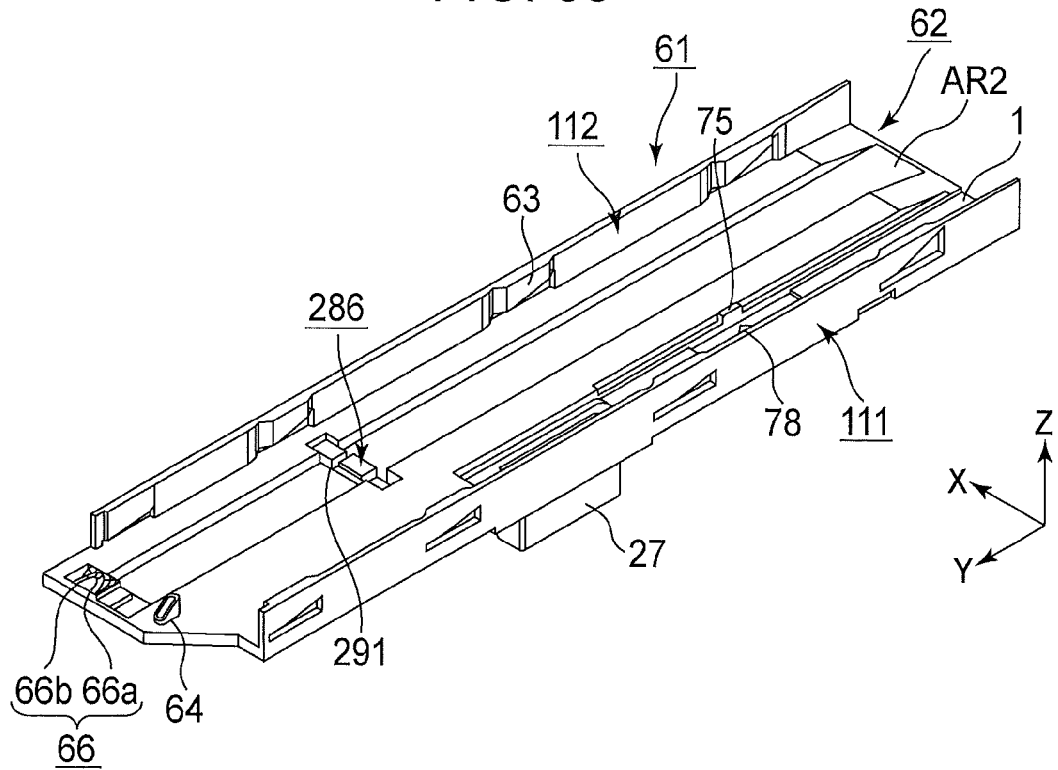
FIG. 53 is a second perspective view of the toner cartridge supporting unit according to the fourth embodiment.

FIG. 53 is a second perspective view of the toner cartridge supporting unit 61 according to the fourth embodiment.

As shown in FIG. 50, the toner cartridge 41 is supported on the toner cartridge supporting unit 61. A side wall (not shown) or a first wall of the toner cartridge 41 extends in the Z-direction and longitudinally in the Y-direction, and a bottom wall 102 or a second wall also extends in the Y-direction. The toner cartridge 41 also includes a back side wall 104 or a fourth wall located at one longitudinal end of the toner cartridge 41 and a front side wall 105 or a fifth wall located at another longitudinal end of the toner cartridge 41. An inclined side wall (not shown) or a second wall extends across the side wall 101 and the bottom wall 102, and meets the front side wall 105 and the back side wall 104.

A mounting surface R1 is formed on the bottom wall 102 of a body 41a of the toner cartridge 41 in the vicinity of the side wall 101 and the front side wall 105. A retainer 287 as a movement limiting member and an installation detecting board 60 are disposed on the mounting surface R1.

In order to prevent inadvertent insertion of the wrong toner cartridge 41, a polarizing projection 285 is formed on the retainer 287 to project from the retainer 287. A polarizing piece 286 (FIGS. 53A and 60B) is disposed on a portion of the recess AR2 of the toner cartridge supporting unit 61, closer to the back end of thereof. The polarizing piece 286 projects substantially perpendicularly from the supporting surface 62 of the toner cartridge supporting unit 61.

The retainer 287 is movable relative to the toner cartridge 41 such that the polarizing projection 285 of the retainer 287 takes up one of its four predetermined limiting positions formed on the toner cartridge 41, the four predetermined limiting positions being aligned in the widthwise direction of the toner cartridge 41 (X-direction). Once the retainer 287 is disposed at one of its four positions, the retainer 287 can only match the right toner cartridge supporting unit 61. The polarizing piece 286 can be disposed in one of its four predetermined positions on the recess AR2, the four positions being aligned in the widthwise direction of the toner cartridge 41 (X-direction). Once the polarizing piece 286 is disposed at one of its four positions in the widthwise direction of the toner cartridge supporting unit 61, the polarizing piece 286 can only match the right toner cartridge supporting unit 61 and the body 37 of the right image forming unit. The polarizing piece 286 has a groove 291 (FIG. 60B) formed therein through which the polarizing projection 285 can pass. The polarizing projection 285 has a thickness just enough to pass through the groove 291.

Therefore, if the above matched polarizing projection 285 and the polarizing piece 286 are applied to the body 37 of the right image forming unit, the toner cartridge 41 is allowed to advance into the receiving space Sp with the polarizing projection 285 not interfering with the polarizing piece 286.

Next, the mounting surface R1 will be described.

Figure 54:
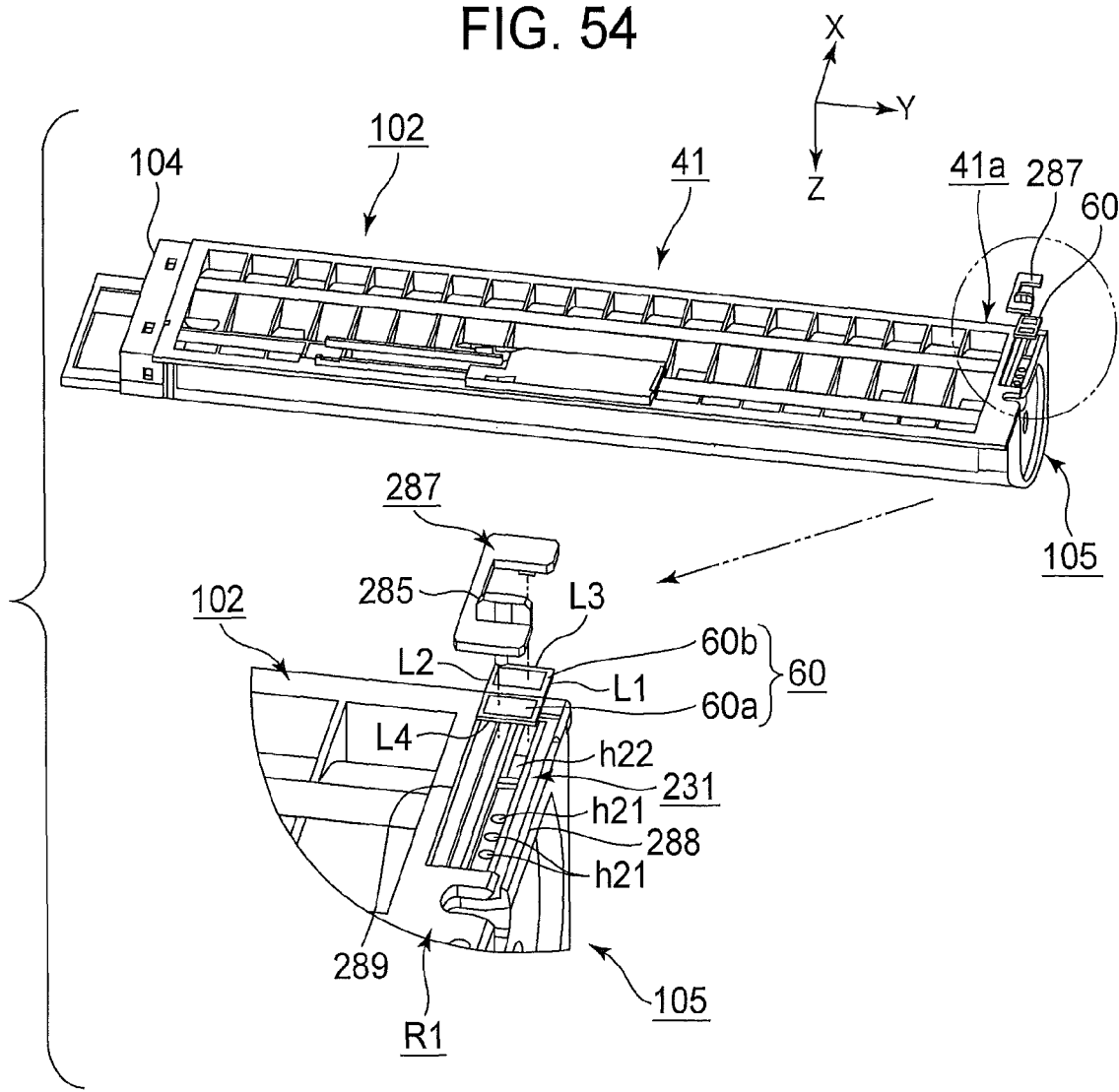
FIG. 54 is a perspective view with a partial expanded view illustrating the toner cartridge according to the fourth embodiment and the installation detecting board mounted on the toner cartridge.

FIG. 54 is a perspective view with a partial expanded view, illustrating the toner cartridge 41 according to the fourth embodiment and the installation detecting board 60 mounted on the toner cartridge 41.

Figure 55:
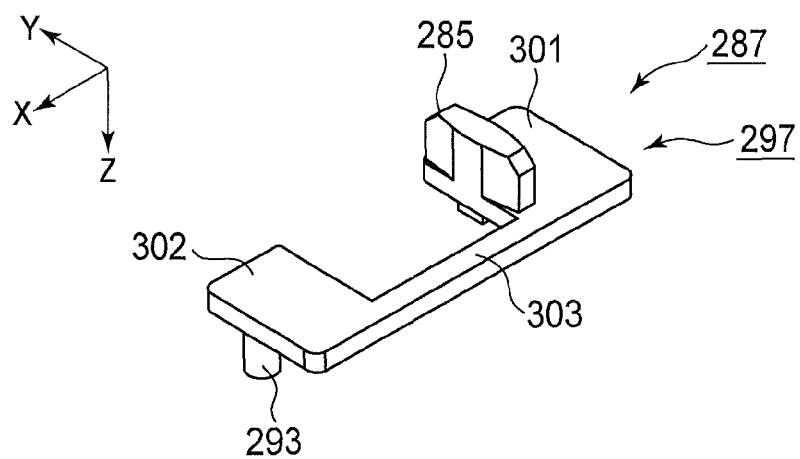
FIG. 55 is a first perspective view of a retainer according to the fourth embodiment.

FIG. 55 is a first perspective view of the retainer 287 according to the fourth embodiment.

Figure 56:
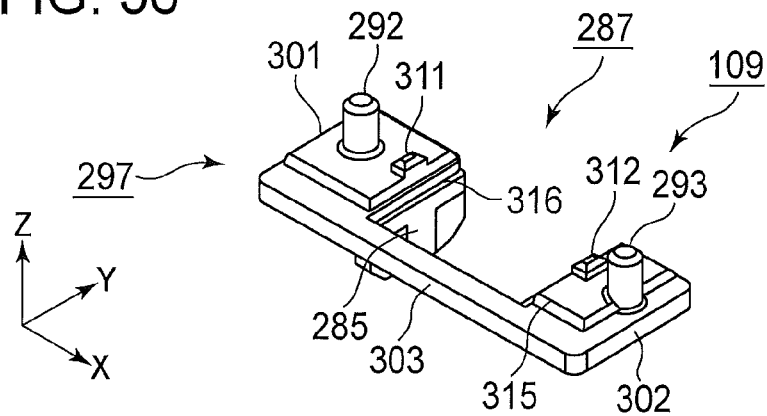
FIG. 56 is a second perspective view of the retainer.

FIG. 56 is a second perspective view of the retainer 287.

Figure 57:
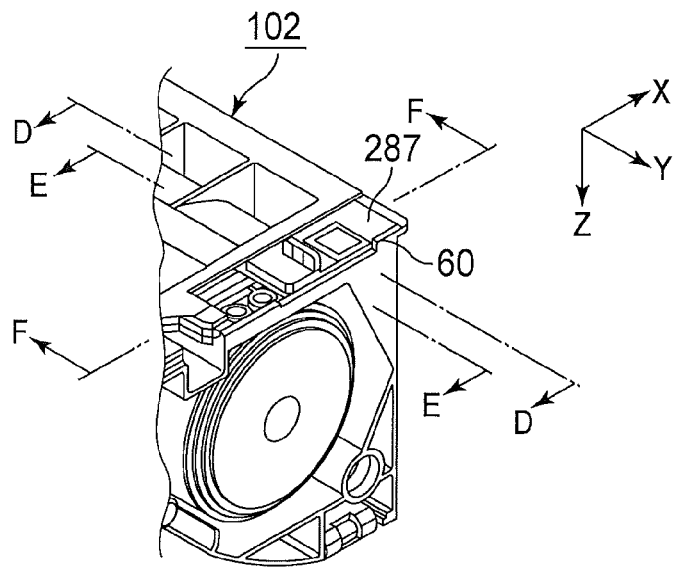
FIG. 57 illustrates the outline of the toner cartridge according to the fourth embodiment.

FIG. 57 illustrates the pertinent portion of the toner cartridge 41 according to the fourth embodiment.

Figure 58:
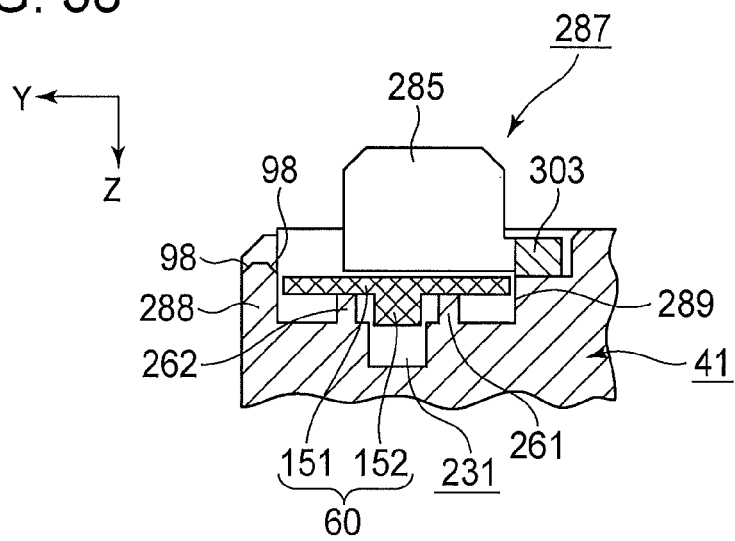
FIG. 58 is a cross-sectional view taken along a line D-D in FIG. 57.

FIG. 58 is a cross-sectional view taken along a line D-D in FIG. 57.

Figure 59:
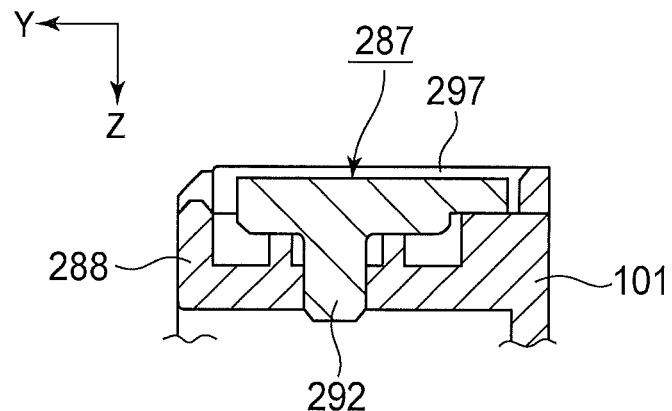
FIG. 59 is a cross-sectional view taken along a line E-E in FIG. 57.

FIG. 59 is a cross-sectional view taken along a line E-E in FIG. 57.

Figure 60A:
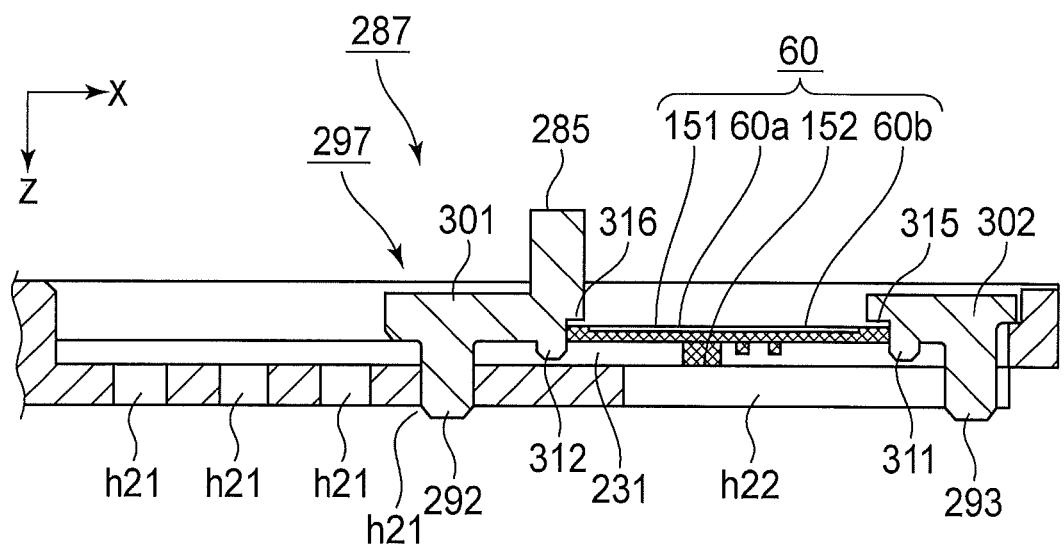
FIG. 60A is a cross-sectional view taken along a line F-F in FIG. 57.

FIG. 60A is a cross-sectional view along a line F-F in FIG. 57.

Figure 60B:
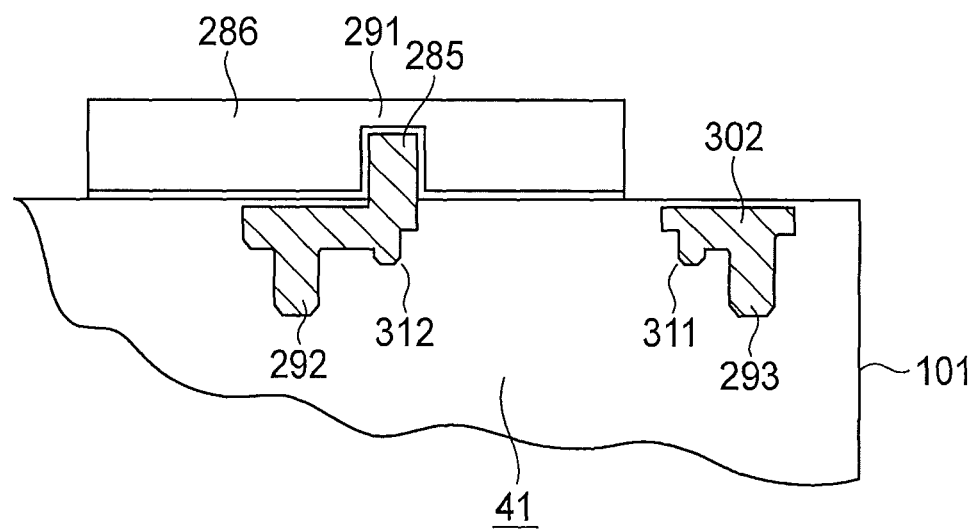
FIG. 60B is a cross-sectional view taken along a line F-F in FIG. 57.

FIG. 60B is another cross-sectional view along a line F-F in FIG. 57.

Referring to FIG. 54, the installation detecting board 60 is mounted on the mounting surface R1. A rectangular recess 231 is formed in the mounting surface R1 adjacent to the front side wall 105, and accommodates the installation detecting board 60 and the retainer 287 therein.

The installation detecting board 60 includes a board 151, a memory 152 mounted on the lower major surface of the board 151, and a first contact 60a and a second contact 60b formed on the upper major surface of the board 151. The first and second contacts 60a and 60b serve as terminals for electrical contact, respectively.

The retainer 287 is attached to the body 41a of the toner cartridge 41, thereby placing the installation detecting board 60 in position and limiting movement of the installation detecting board 60 in the recess 231.

Referring to FIG. 58, a first positioning element 288 and a second positioning element 289 rise from the bottom floor of the recess 131, and abut the first edge L1 and the second edge L2 of the installation detecting board 60, respectively, thereby positioning the installation detecting board 60 in the widthwise direction (Y-direction) of the recess 231. Ribs 261 and 262 are formed on the bottom of the recess 231 to project upward toward the lower major surface of the board 151 of the installation detecting board 60, and to extend in the longitudinal direction of the recess 231 (X-direction).

The first and second positioning elements 288 and 289 extend in the longitudinal direction of the recess 231 (X-direction). The top of the first positioning element 288 is lower than that of the second positioning element 289 as shown in FIG. 58. The first positioning element 288 is a lower wall.

As shown in FIG. 55, the retainer 287 has a generally U-shaped flat portion 297, which includes a first side 301, a second side 302, and a side 303 connecting the first and second sides. The retainer 287 also includes the polarizing projection 285 that rises from the first side 301 in the direction perpendicular to the surface of the flat portion 297.

A first post 292 or a first engagement projection and a second post 293 or a second engagement projection are cylindrical projections formed in the vicinity of the longitudinal (X-direction) end portions of the retainer 287. The first post 292 projects downward from the first side 301 and the second pose 293 projects downward from the second side 302. Referring to FIG. 60A, four holes h21 are formed in the bottom of the recess 231. One of the holes h21 receives the first post 292 therein. An elongate hole h22 or a second engagement projection is formed in the bottom of the recess 231 to extend in the longitudinal direction of the recess 231, and receives the second post 293 therein. When the first post 292 is press-fitted into one of the four holes 21 and the post 293 is press-fitted into the elongate hole h22, the toner cartridge 41 is mounted such that the installation detecting board 60 is positioned in the longitudinal direction of the recess 231.

In the fourth embodiment, using the five holes including the four holes h21 and the elongate hole h22, the retainer 287 can be positioned at any one of four different locations. Instead, the retainer 287 may be selectively positioned at more than two locations. Four additional holes may be formed in place of the elongate hole h22 so that the second post 293 is received in one of the four additional holes.

The retainer 287 has a first positioning portion 311 and a second positioning portion 316. The second positioning portion 316 is formed on a portion of the first side 301 closer to the second side 302, and projects toward the second side 302. The retainer 287 also has a first positioning portion 312 and a second positioning portion 315. The second positioning portion 315 is formed on a portion of the second side 302 closer to the first side 301 and projects toward the first side 301.

The first positioning portion 311 abuts the edge L4 of the installation detecting board 60, and the first positioning portion 312 abuts the edge L3 of the installation detecting board 60, so that the installation detecting board 60 is friction-fitted into the space between the first positioning portions 311 and 312. The first positioning portion 311 and first positioning portion 312 are located substantially at widthwise middle points of the first side 301 and the second side 302, respectively. The first positioning portions 311 and 312 abut the bottom of the recess 231, serving to position the installation detecting board 60 in the Z-direction. The second positioning portion 315 and second positioning portion 316 extend in the widthwise direction of the retainer 287 as shown in FIG. 56.

The first positioning element 288 abuts the first edge L1 and the second positioning element 289 abuts the second edge L2, thereby positioning the installation detecting board 60 in the widthwise direction of the recess 231. The first positioning portion 311 abuts the third edge L4 and the first positioning portion 312 abuts the fourth edge L3, thereby limiting movement of the installation detecting board 60 in the longitudinal direction of the recess 231. The second positioning portion 315 abuts the third edge L3 from above and the second positioning portion 316 abuts the fourth edge L4 from above, thereby limiting movement of the installation detecting board 60 in the direction of depth (Z-direction) of the recess 231. The ribs 261 and 262 abut the lower major surface of the board 151 from under, thereby positioning the installation detecting board 60 in the direction of depth of the recess 231.

Next, a description will be given of how the installation detecting board 60 is mounted on the toner cartridge 41.

The installation detecting board 60 is placed on the mounting surface R1 of the bottom wall 102 of the toner cartridge 41, and is directed into the space bounded by the first and second positioning elements 288 and 289. At this time, the installation detecting board 60 is movable in contact with the ribs 261 and 262. The first and second positioning elements 288 and 289 limit movement of the installation detecting board 60 in the widthwise direction of the recess 231.

Subsequently, the first post 292 of the retainer 287 is press-fitted into one of the holes h21 and the second post 293 is press-fitted into the elongate hole h22, thereby mounting the retainer 287 to the body 41a of the toner cartridge 41. In this manner, the retainer 287 is positioned in the longitudinal direction and the direction of depth of the recess 231, thereby limiting movement of the installation detecting board 60 both in the longitudinal direction and direction of depth of the recess 231.

Next, a description will be given of the retainer 287 mounted on the toner cartridge 41 at four different positions.

Figure 61:
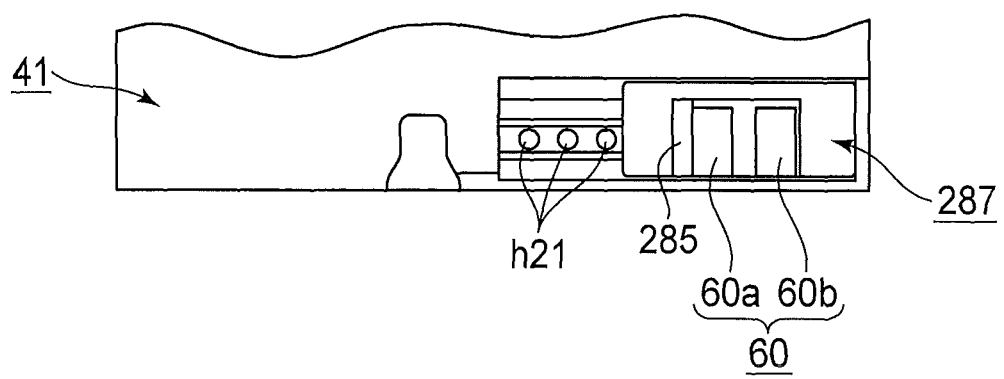
FIG. 61 is a first view illustrating the retainer according to the fourth embodiment when the retainer is mounted on the toner cartridge at a first position.

FIG. 61 is a first view illustrating the retainer 287 according to the fourth embodiment, when the retainer 287 is mounted on the toner cartridge 41 at a first position.

Figure 62:
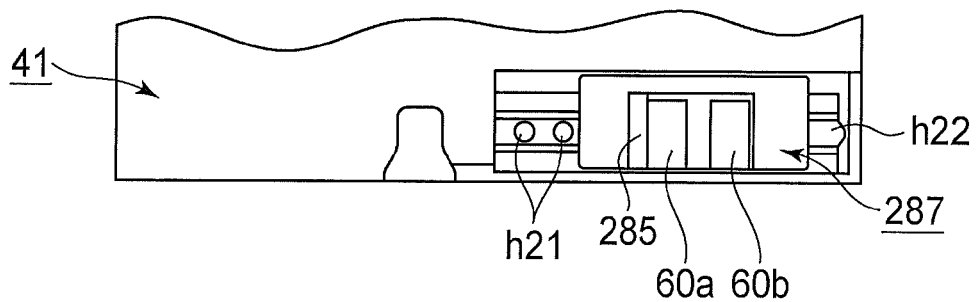
FIG. 62 is a second view illustrating the retainer according to the fourth embodiment when the retainer is mounted on the toner cartridge at a second position.

FIG. 62 is a second view illustrating the retainer 287 according to the fourth embodiment, when the retainer 287 is mounted on the toner cartridge 41 at a second position.

Figure 63:
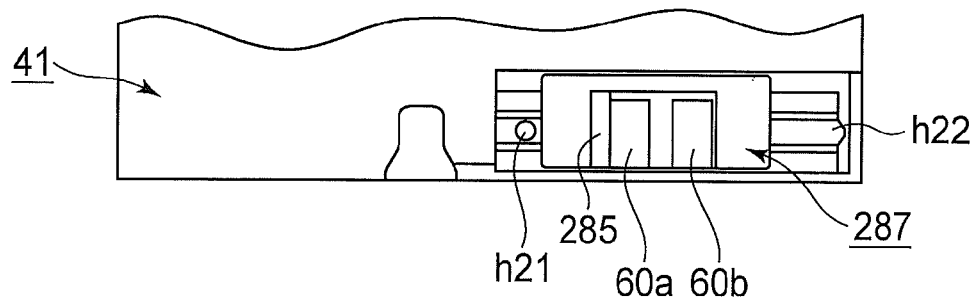
FIG. 63 is a third view illustrating the retainer according to the fourth embodiment when the retainer is mounted on the toner cartridge at a third position.

FIG. 63 is a third view illustrating the retainer 287 according to the fourth embodiment, when the retainer 287 is mounted on the toner cartridge 41 at a third position.

Figure 64:
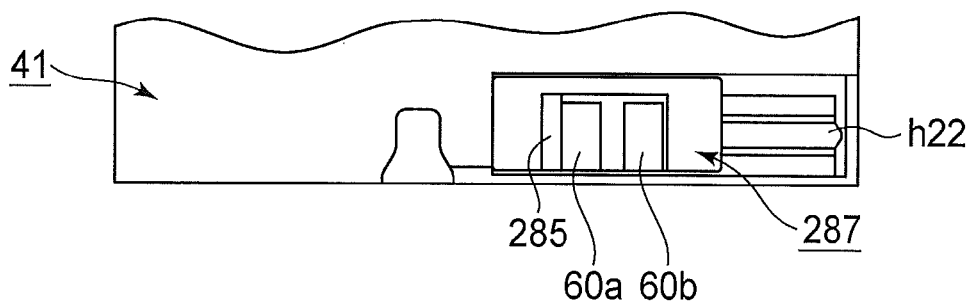
FIG. 64 is a fourth view illustrating the retainer according to the fourth embodiment when the retainer is mounted on the toner cartridge at a fourth position.

FIG. 64 is a fourth view illustrating the retainer 287 according to the fourth embodiment, when the retainer 287 is mounted on the toner cartridge 41 at a fourth position.

The retainers 287 are mounted at different positions on the toner cartridge 41 for different colors of toner. For example, FIGS. 61, 62, 63, and 64 illustrate the positions of the retainers 287 for black, yellow, magenta, and cyan toner cartridges 41, respectively. In this way, the polarizing projection 285 can be positioned at different locations for different colors of toner.

As described above, the retainer 287 has the polarizing projection 285 formed thereon and therefore the overall cost of the toner cartridge 41 may be low.

While the first to fourth embodiments have been described with respect to a printer, the present invention may be applied to other apparatus including copying machines, facsimile machines, and multi-function peripherals (MFP).

While the installation detecting board 60 is used in the respective embodiments, the installation detecting board 60 may be replaced with a fuse, in which case the fuse is blown upon attachment of the right toner cartridge to the printer. The fuse is blown to indicate that the toner cartridge is the right one. The controller checks the status of the fuse to determine whether the toner cartridge attached to the printer is the right, matched one, and subsequently obtains the type of the toner cartridge and other information from the toner cartridge.

The invention being thus described, it will be obvious that the same may be varied in many ways. Such variations are not to be regarded as a departure from the scope of the invention, and all such modifications as would be obvious to one skilled in the art are intended to be included within the scope of the following claims.

What is claimed is:

1. A replaceable unit removably inserted into an apparatus, comprising:
    an installation detector board having a major surface, a first edge, a second edge, a third edge, and a fourth edge, the first edge being on a side of the installation detector board opposite the second edge and the third edge being on a side of the installation detector board opposite the fourth edge;
    a body in which a first positioning portion and a second positioning portion are formed and aligned in a first direction such that the first positioning portion abuts the first edge and the second positioning portion abuts the second edge; and
    a retainer separate from the body and mounted on the body in a press-fitted relation, the retainer abutting at least one of (i) the third edge and a part of the major surface in the vicinity of the third edge and (ii) the fourth edge and a part of the major surface in the vicinity of the fourth edge, substantially preventing the installation detector board from moving relative to the body in a second direction substantially normal to the major surface and in a third direction substantially parallel to the major surface.

2. The replaceable unit according to claim 1, wherein the body includes a third positioning portion formed therein such that the third positioning portion abuts the third edge;
    wherein the retainer includes a first abutment that abuts the fourth edge; and
    wherein a distance between the first abutment and the third positioning portion is longer than a distance between the third edge and the fourth edge.

3. The replaceable unit according to claim 2, wherein the body includes a recess formed in a surface thereof, the recess receiving the installation detector board therein;
    wherein the recess includes a first wall and a second wall that opposes the first wall, a distance between the first wall and the second wall being longer than the distance between the first abutment and the third positioning portion.

4. The replaceable unit according to claim 1, wherein the retainer includes a first abutment that abuts the fourth edge and a second abutment that abuts a portion of a major surface of the installation detector board in the vicinity of the fourth edge.

5. The replaceable unit according to claim 1, wherein:
    the body includes a first abutment that abuts the third edge, and a third abutment that abuts a portion of a major surface of the installation detector board in the vicinity of the third edge; and
    the retainer includes a second abutment that abuts the fourth edge, and a fourth abutment that abuts a portion of a major surface of the installation detector board in the vicinity of the fourth edge.

6. The replaceable unit according to claim 1, wherein the replaceable unit is a developer holding apparatus that holds a developer material therein.

7. The replaceable unit according to claim 1, wherein the replaceable unit is inserted into the apparatus in a direction parallel to the first direction.

8. The replaceable unit according to claim 1, wherein the first positioning portion and the second positioning portion extend in directions substantially perpendicular to the first direction.

9. The replaceable unit according to claim 8, wherein the first positioning portion has a greater height than the second positioning portion.

10. The replaceable unit according to claim 9, wherein the body extends in a longitudinal direction thereof and includes a first longitudinal end and a second longitudinal end opposite to the first longitudinal end; and
    wherein the first positioning portion and the second positioning portion are formed on a longitudinal end portion in the vicinity of the first longitudinal end and the first positioning portion is closer to the first longitudinal end than the second positioning portion.

11. The replaceable unit according to claim 3, wherein the retainer includes an engagement portion and the recess includes a hole formed in a bottom thereof, the engagement portion being press-fitted into the hole.

12. The replaceable unit according to claim 1, wherein the body includes a recess formed therein and a projection that projects from a bottom of the recess and directly faces one of the major surfaces of the installation detector board.

13. The replaceable unit according to claim 12, wherein the projection determines a distance between the installation detector board and the bottom of the recess.

14. The replaceable unit according to claim 12, wherein the projection extends in the first direction.

15. The replaceable unit according to claim 1, wherein the installation detecting board takes the form of a circuit board on which a memory is mounted.

16. An image forming apparatus that incorporates the replaceable unit according to claim 1.

17. The image forming apparatus according to claim 16, comprising a supporting unit such that the replaceable unit is slidable on the supporting unit when the replaceable unit is inserted into the image forming apparatus.

18. The replaceable unit according to claim 5, wherein the replaceable unit includes a recess formed therein and extending in a second direction substantially perpendicular to the first direction, and the retainer includes a projection such that the retainer is positioned at one of a plurality of positions formed in a bottom of the recess and aligned in the second direction.

19. A replaceable unit removably inserted into an apparatus, comprising:
- an installation detector board having a first edge, a second edge, a third edge, and a fourth edge, the first edge being on a side of the installation detector board opposite the second edge and the third edge being on a side of the installation detector board opposite the fourth edge;
- a body in which a first positioning portion and a second positioning portion are formed and aligned in a first direction such that the first positioning portion abuts the first edge and the second positioning portion abuts the second edge; and
- a retainer mounted on the body, the retainer abutting at least one of the third edge and the fourth edge, substantially preventing the installation detector board from moving relative to the body;
- wherein the retainer includes a first abutment that abuts the third edge, a second abutment that abuts the fourth edge, a third abutment that abuts a portion of a major surface of the installation detector board in the vicinity of the third edge, and a fourth abutment that abuts a portion of a major surface of the installation detector board in the vicinity of the fourth edge; and
- wherein the replaceable unit includes a recess formed therein and extending in a second direction substantially perpendicular to the first direction, and the retainer includes a projection such that the retainer is positioned at one of a plurality of positions formed in a bottom of the recess and aligned in the second direction.

20. The replaceable unit according to claim 19, wherein when the replaceable unit is inserted into the apparatus, the first longitudinal end first enters the apparatus; and
- wherein the installation detector board is disposed in the vicinity of the first longitudinal end.

21. The replaceable unit according to claim 19, wherein the projection extends in the first direction.

22. An image forming apparatus that incorporates the replaceable unit according to claim 19.

23. A method for mounting a circuit board into a recess formed in a replaceable unit, the circuit board including a first edge, a second edge, a third edge, a fourth edge, and electronic components mounted thereon, the method comprising:
- inserting the circuit board into the recess with the first edge and the second edge abutting first and second positioning portions, respectively, formed in a perimeter portion of the recess;
- inserting the circuit board further into the recess in a direction substantially perpendicular to a direction in which the first and second positioning portions are aligned, the circuit board being inserted until the third edge enters under a third positioning portion formed in a perimeter portion of the recess; and
- mounting a retainer into the recess such that the retainer abuts the fourth edge and a portion of a major surface the circuit board in the vicinity of the fourth edge is under the retainer.

* * * * *